United States Patent [19]

Naitoh et al.

[11] Patent Number: 5,040,150
[45] Date of Patent: Aug. 13, 1991

[54] SEMICONDUCTOR INTEGRATED CIRCUIT DEVICE

[75] Inventors: Mitsugu Naitoh; Junichi Shikatani, both of Kawasaki, Japan

[73] Assignee: Fujitsu Limited, Kawasaki, Japan

[21] Appl. No.: 527,977

[22] Filed: May 24, 1990

[30] Foreign Application Priority Data

May 31, 1989 [JP] Japan .................................. 1-137879
May 31, 1989 [JP] Japan .................................. 1-137880

[51] Int. Cl.⁵ .............................................. G11C 13/00
[52] U.S. Cl. .............................. 365/201; 365/189.04; 371/21.1
[58] Field of Search ....................... 365/189.01, 189.03, 365/189.04, 189.06, 230.01, 230.05, 201, 230.09; 371/21

[56] References Cited

U.S. PATENT DOCUMENTS 4,953,129  8/1990  Kobayashi et al. ................. 365/203

Primary Examiner—Terrell W. Fears
Attorney, Agent, or Firm—Armstrong, Nikaido, Marmelstein, Kubovcik & Murray

[57] ABSTRACT

A semiconductor integrated circuit device comprising a first circuit forming a random logic and outputting a plurality of first parallel data of plural bits, a second circuit which receives the plurality of first parallel data and supplies a plurality of second parallel data of plural bits to the first circuit, and a test circuit which divides a part of external parallel data of plural bits smaller in number than the first parallel data into a plurality of third parallel data of plural bits in such a manner that the plurality of third parallel data correspond in number to the plurality of first parallel data.

14 Claims, 21 Drawing Sheets

MACRO TEST MODE

WRITE MODE

MACRO TEST MODE
SIGNAL (MTM)

BIT SELECTING
SIGNAL (BS0 - BSa)

TEST ADDRESS
SIGNAL
(TA0 - TA(a-1))

1 Cycle

TEST WRITE
ENABLE SIGNAL
(TWE)

SET-UP TIME | HOLD TIME

TEST DATA INPUT
SIGNAL
(TI0 - TI(n-1))

VALID

2:4 DECODER

2:3 DECODER

SEMICONDUCTOR INTEGRATED CIRCUIT DEVICE

FIELD OF THE INVENTION

The present invention relates to a semiconductor integrated circuit (IC) device, and more particularly to a composite semiconductor IC device wherein a random logic circuit and a macro cell such as a RAM (random access memory), ROM (read only memory) and multiplier are mounted together within the same chip.

The invention especially relates to an improvement in the test circuit for the macro cell which can reduce the number of the test terminals.

DESCRIPTION OF THE PRIOR ART

With recent advances in semiconductor fabricating technologies, the number of gates which can be mounted on and within one IC chip has been exponentially increased, and semiconductor ICs have been produced which can contain from several tens of thousands of gates to several hundreds of thousands of gates. However, the number of gates which can be mounted on the random logic part of one IC chip is several tens of thousands at the most. If the number of gates becomes over several tens of thousands, then the logic design and logic verification become extremely difficult. For this reason, it is necessary to mount a macro cell such as a RAM, ROM, multiplier and ALU (arithmetic and logic unit), and when a macro cell having a larger bit width is mounted, the testing method comes into question.

In most cases, the test circuit and test pattern for the macro cell of the composite semiconductor IC device have so far been prepared by logic designers (users). That is, since changes in the bit and word widths mean that the size of the macro cell changes and accordingly the test circuit also changes, the test circuit has been prepared by logic designers. However, since a burden on the logic designers will become extremely large if various kinds of macro cells are mounted or if the number of macro cells is increased, it is becoming necessary that the macro cells be tested at the vendor side of semiconductor IC devices.

In order to execute the test at the semiconductor vendor side, a circuit for the test is needed, and there are roughly two kinds of test methods. One is a method which reads data in series with the use of scan flip-flops, and another is a method in which the entire terminals of a macro cell to be tested are controlled directly with external terminals. In the former method, the scan flip-flops are connected in series and an external clock is inputted in normal mode state to the flip-flops. After the input to the flip-flops, the flip-flops are set to scan mode state. With scan-in terminals as inputs and scan-out terminals as outputs, scan clocks are provided by the number of the flip-flops in order to shift and read data in series.

The former method for a semiconductor IC device has its advantages in that the number of external terminals is reduced. However, the former method has its disadvantages in that the number of test patterns for reading out data in series is increased, since the number of gates for using scan flip-flops is increased. For example, if the bit width and word width are 46, then 46 scan flip-flops are needed, and the number of the logic circuits used for these flip-flops are thus considerably increased. Consequently, the former method is unsuitable to the RAM test.

In the latter method, the number of gates and the number of test patterns are reduced. However, since the test patterns are inputted from the external terminals of a LSI (large scale integration) directly to the macro cell, a great number of the external terminals are needed. Consequently, when a RAM, ROM, multiplier or ALU having a large bit number is used, there are some cases where the number of terminals required for the test exceeds the number of usable terminals wherein a terminal for a power source is subtracted from the number of terminals of the package. In addition, although most test terminals can be used in common with terminals for users, if terminals are used in common, load on the commonly used terminals becomes large and the delayed time is increased. Consequently, there are some cases where characteristics desired by logic designers cannot be obtained, and therefore the number of common terminals that can be actually used is considerably reduced. Since in the prior art the bit width was relatively short, the above described problem was not very important. In recent years, the bit width is becoming extremely large, and therefore an increase in the number of test external terminals has presented a serious problem.

In addition, demand for mounting a multiport RAM on an IC chip has also considerably increased. However, in general it is difficult to test a multiport RAM which has been mounted within an IC chip. In many cases, it is necessary to provide an additional test circuit. In conventional RAM testing methods for testing RAMs mounted in a composite LSI, there are roughly two methods. One is a method wherein the RAM is tested using a random logic circuit, and another is a method wherein the RAM is tested using an additional test circuit. In the former method, it is difficult to provide addresses and inputs in the RAM through the random logic circuit. In addition, it is likewise difficult to judge an expected value of output at the exterior of the LSI. Consequently, the latter method has been widely used. In this method, the input and output of the RAM are all controlled directly from the test external terminals of the LSI, and test patterns are supplied from the test external terminals to the RAM. Since the output from the RAM is also outputted directly to the external terminals of the LSI, the RAM can be easily tested. However, a large number of input and output terminals are required in order to test the RAM by the conventional test circuit. Particularly, since in a multiport RAM the number of terminals becomes over two times the number of terminals of a single port RAM, it is not easy to assure test terminals. Therefore, in case of a RAM having a large number of bits or ports, the number of terminals for a RAM test is insufficient. If the test terminals are used in common, an additional circuit for the common terminals is needed. Load on the common terminals becomes large and the delayed time is thus increased. This gave rise to the problem that the characteristics of I/O cells are deteriorated.

Accordingly, it is an object of the present invention to provide an improved semiconductor IC device which is capable of greatly reducing the number of test external terminals without increasing the number of gates.

It is another object of the present invention to provide an improved semiconductor IC device which is capable of greatly reducing the number of test terminals which are required in testing a multiport RAM.

SUMMARY OF THE INVENTION

The foregoing objects are accomplished in accordance with the present invention by providing a semiconductor integrated circuit device comprising a first circuit forming a random logic and outputting a plurality of first parallel data of plural bits, a second circuit which receives the plurality of first parallel data and supplies a plurality of second parallel data of plural bits to the first circuit, and a test circuit which divides a part of external parallel data of plural bits smaller in number than the first parallel data into a plurality of third parallel data of plural bits in such a manner that the plurality of third parallel data correspond in number to the plurality of first parallel data.

The test circuit may comprise an input selector part for switching the plurality of first parallel data and the external parallel data in response to external switch signals, the external parallel data comprising at least the plurality of third parallel data, and the selector part comprising at least input selector circuits corresponding in number to the plurality of third parallel data.

The second circuit may comprise a single port random access memory.

The second circuit may also comprise two single port random access memories.

The second circuit may also comprise a single port random access memory and a read only memory.

The second circuit may also comprise a single port random access memory and a multiplier.

The second circuit may also comprise a multiport memory.

The second circuit may also comprise a dual port memory.

The second circuit may also comprise two dual port memories.

The second circuit may also comprise a triple port memory.

The second circuit also comprise a multiport memory and a read only memory.

The foregoing objects are also accomplished in accordance with the present invention by providing a semiconductor integrated circuit device comprising a random logic circuit, a multiport memory having a plurality of inlet and outlet ports, and a test circuit for testing the multiport memory in response to an external test data, the test circuit being constructed in such a manner that the test data is divided every port of the multiport memory and that the multiport memory is tested as single port memories in accordance with the divided test data.

The foregoing objects are also accomplished in accordance with the present invention by providing a semiconductor integrated circuit device comprising a random logic circuit, a single port memory, a multiport memory, and a test circuit for testing the single port and multiport memories in response to an external test data, the test circuit being constructed in such a manner that it divides the single port and multiport memories into a plurality of parts having predetermined bit widths and tests the parts.

BRIEF DESCRIPTION OF THE DRAWINGS

The above and other objects and advantages will become apparent from the following detailed description when read in conjunction with the accompanying drawings wherein.

DESCRIPTION OF THE PREFERRED EMBODIMENTS

In accordance with the present invention, there is provided a test circuit which is constructed in such a manner that one macro cell is divided into a plurality of macro cells having predetermined bit widths and tested as a plurality of macro cells. The macro cell can be controlled directly from the exterior. A macro test mode signal MTM is inputted through a dedicated terminal and selects a normal mode or a test mode of the macro cell. The other signals necessary for the macro cell test are inputted through common external terminals used in the normal mode. The macro cell used herein has a plurality of bit widths and a plurality of functional blocks, and represents a RAM, ROM, multiplier, ALU and the like.

Figure 1:
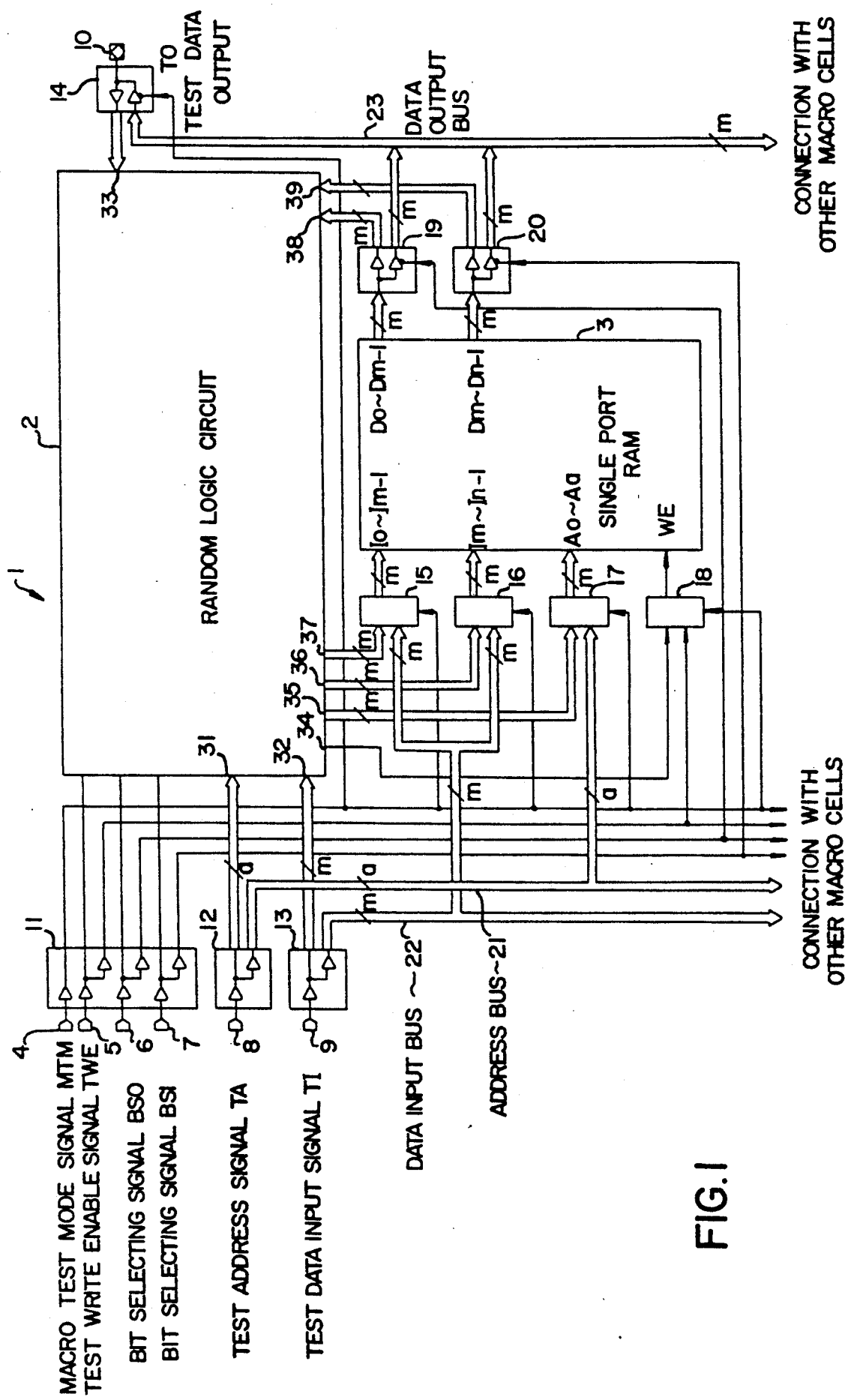
FIG. 1 is a schematic diagram used to explain the basic principles of the present invention which is applied to a semiconductor IC device in which a random logic circuit and a single port RAM are mounted together.

FIGS. 1-7 are used to explain the basic principles of the present invention which is applied to a semiconductor IC device in which a random logic circuit and a single port RAM are mounted together. In FIG. 1, a semiconductor IC device 1 is constructed to include a random logic circuit 2, a single port RAM 3, external input terminals 4-9, an external input/output terminal 10, input buffers 11-13, a two-way input/output buffer 14, selector circuits 15-18, bus drivers 19 and 20, a test address bus 21, a test data input bus 22, and a test data output bus 23.

To the external input terminal 4 is inputted a macro test mode selecting signal MTM. To the external input terminal 5 is inputted a test write enable signal TWE in the test mode. To the external input terminals 6 and 7 are respectively inputted bit selecting signals BS0 and BS1 that are used in performing a bit division test. To the external input terminal 8 is inputted a test address signal TA. To the external input terminal 9 is inputted a test data input signal TI. From the external input/output terminal 10 is outputted a test data output signal TO for the test circuit. Reference numeral 31 is a data input to the random logic circuit 2 when the test address terminal and the random logic circuit terminal are used in common, and 32 a data input to the random logic circuit 2 when the test data input terminal and the random logic circuit terminal are used in common. Reference numeral 33 is a data input to the random logic circuit 2 when the test data output terminal and the random logic circuit terminal are used in common, 34 a write enable signal from the random logic circuit 2, and 35 an address signal from the random logic circuit 2. Reference numerals 36, 37 are data input signals from the random logic circuit 2, and 38, 39 data output signals to the random logic circuit 2.

The bit width of the address bus 21 is equal to the number of the address terminals of the single port RAM 3 and inputted to the RAM 3. The bit width of the data input bus 22 is determined by the bit width maximum among the divided bit widths of the single port RAM 3. For example, if it is desired to divide into two a RAM having a bit width of 15 bits, the bit width of the data input bus 22 will become 8 bits since 15 bits can be divided into 8 bits and 7 bits. In the same way as the data input bus 22, the bit width of the data output bus 23 is also determined by the bit width maximum among the divided bit widths of the single port RAM 3. In case of a RAM, data input and data output are identical in bit width. Note that the input buffers 11-13 are a combination of input and input, but they may be a combination of input and two-way input/output, by controlling the macro test mode selecting signal MTM. Likewise, the two-way input/output buffer 14 may also be a combination of output and output or a combination of output and two-way input/output. In addition, only one buffer 12, one buffer 13 and one buffer 14 are shown in FIG. 1 for clarity, but it is necessary to provide a plurality of buffers 12 corresponding in bit width to the address bus 21, a plurality of buffers 13 corresponding in bit width to the data input bus 22, and a plurality of buffers 14 corresponding in bit width to the data output bus 23.

Figure 2:
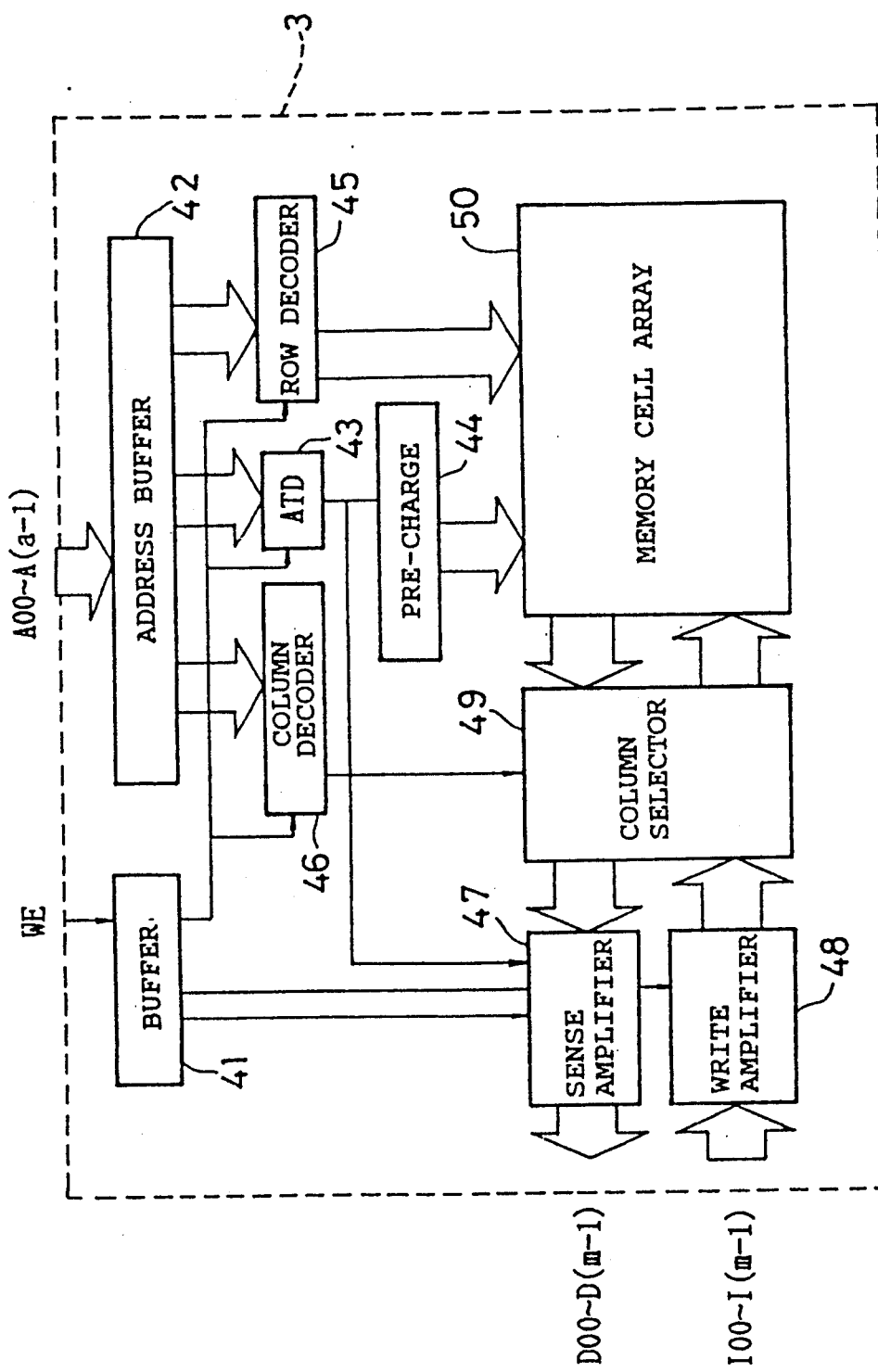
FIG. 2 is a block diagram of the single port RAM of FIG. 1.
Figure 3:
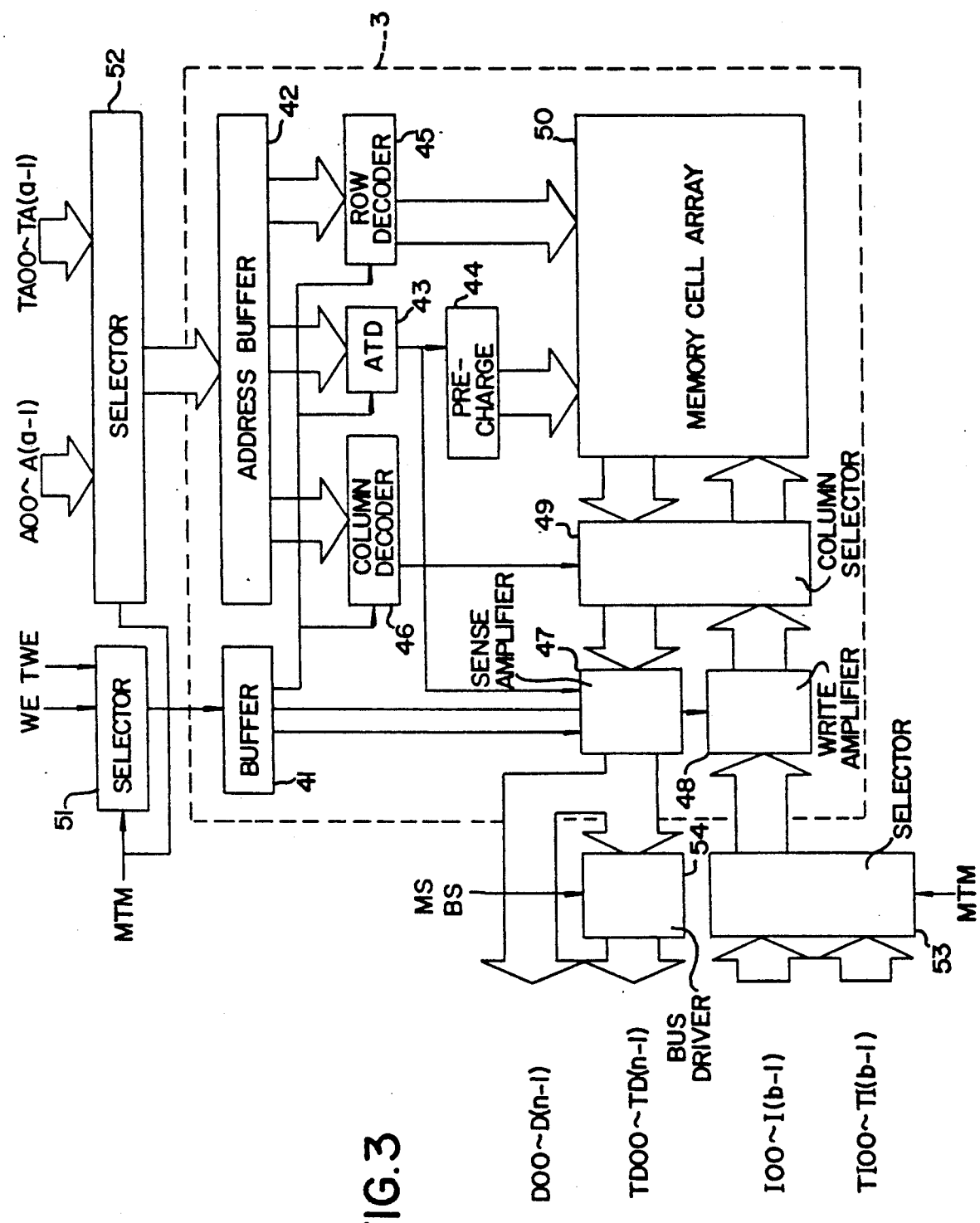
FIG. 3 is a block diagram of a single port RAM into which a test circuit is incorporated.

FIG. 2 is a block diagram of the single port RAM 3, and FIG. 3 is a block diagram of the single port RAM 3 into which a test circuit of the present invention is incorporated. In FIGS. 2 and 3, the single port RAM 3 is constituted by a buffer 41, an address buffer 42, an address-transition detecting (ATD) circuit 43, a pre-charge circuit 44, a row decoder 45, a column decoder 46, a sense amplifier 47, a write amplifier 48, a column selector 49, and a memory cell array 50 having memory cells arranged with a predetermined capacity in the row and column directions of a matrix. A write enable signal WE to store (write) and retrieve (read) data is buffered by the buffer 41 and outputted to the row decoder 45, column decoder 46, sense amplifier 47 and to the write amplifier 48. In addition, external addresses A00 through A(a−1) wherein row addresses and column addresses are multiplexed are buffered by the address buffer 42, and outputted to the address-transition detecting circuit 43, the row decoder 45, and to the column decoder 46. The address-transition detecting circuit 43 detects the transition state of the external addresses that have been sent from the address buffer 42, and transfers it to the pre-charge circuit 44 and sense amplifier 47. In accordance with the detected result, the pre-charge circuit 44 precharges the data line of the memory cell array 50. The row decoder 45 decodes the transferred external addresses or internal addresses, and, according to this decoded result, selects and activates one of a large number of word lines of the memory cell array 50. The column decoder 46 decodes the transferred external addresses and outputs them to the column selector 49. The write amplifier 48 buffers external data I00 through I(m−1), and outputs these data to the column selector 49, which selects one of the bit lines of the memory cell array 50 in response to the decoded result from the column decoder 46. The sense amplifier 47 amplifies the electric potential of the bit line that has been selected through the column selector 49, and reads out the data D00 through D(m−1) of the memory cell 50 connected to the selected bit line.

The internal construction of the single port RAM 3 shown in FIG. 3 is the same construction as the prior art, but the single port RAM 3 is different from the prior art in that, in addition to the signals from the random logic circuit 2, signals are inputted from the external terminals through the test circuit. That is, as shown in FIG. 3, the write enable signal WE from the random logic circuit 2 and the test write enable signal TWE in the test mode are inputted to a selector 51, which selects one of the signals by the macro test mode selecting signal MTM and outputs it to the buffer 41. As an input from the normal mode side, the external addresses A00 through A(a−1) are inputted from the random logic circuit 2 to a selector 52 and selected by the macro test mode selecting signal MTM. In addition, as an input from the normal mode side, input data I00 through I(b−1) that have been divided to plural number (in this embodiment, two) are inputted from the random logic circuit 2 to a selector 53, to which external test input data TI00 through TI(b−1) of the semiconductor IC device 1 are also inputted. These input data are selected by the macro test mode selecting signal MTM. On the other hand, the data of the memory cell array 50 are outputted through the column selector 49 and the sense amplifier 47 to the exterior of the single port RAM 3, as outputs D00 through D(n−1) to the user side, and also to a bus driver 54. In accordance with the bit selecting signal BS, the bus driver 54 outputs data of a predetermined bit to the exterior, as test output data TD00 through TD(n−1). In that case, a selector may be used instead of the bus driver 54. The above described selector 51, selector 52, selector 53 and bus driver 54 correspond to the selector circuit 18, selector circuit 17, selector circuits 15, 16, and bus drivers 19, 20 of FIG. 1, respectively, and constitute the above described test circuit.

Figure 4:
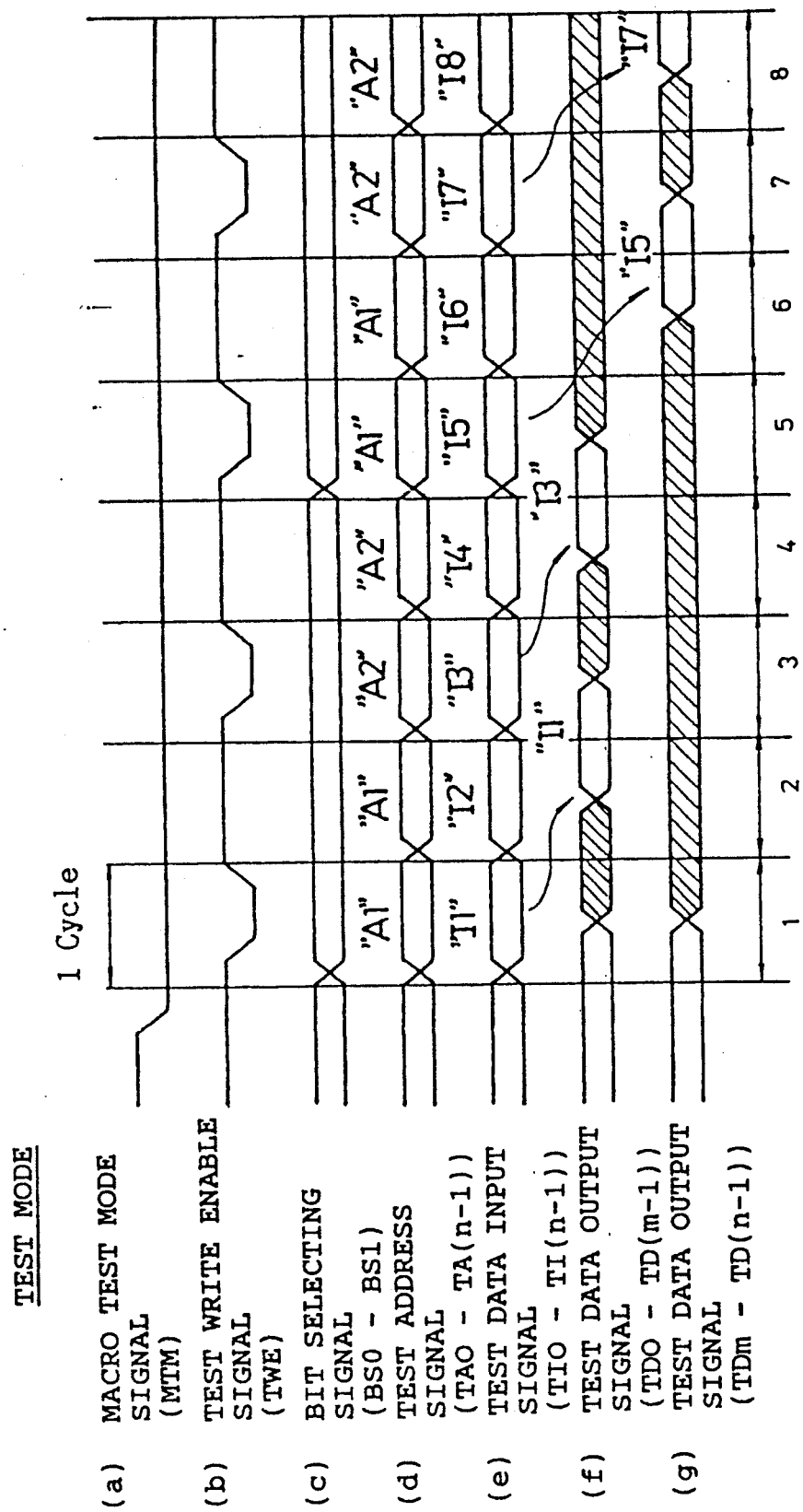
FIGS. 4 through 7 are timing diagrams of the structure shown in FIG. 1.

FIGS. 4–7 are timing diagrams of the device shown in FIG. 1, and FIGS. 5–7 are detailed timing diagrams of FIG. 4. In FIG. 4, if the macro test mode selecting signal MTM is made "L", then the test circuit becomes its test mode. When the test write enable TWE in the test mode is made "L", writing becomes possible. If the test address signals TA0 through TA(n−1) shown in FIG. 4(d) have been selected, then their test data input signals TI0 through TI(n−1) shown in FIG. 4(e) are written on the single port RAM 3 (FIG. 4(c)). In the next cycle, if the test write enable signal TWE is made "H" and thus the test circuit becomes its reading state, then test data output signals TD0 through TD(m−1) or TDm through TD(n−1) that have been written in response to the outputs of the bit selecting signals BS0 through BS1 shown in FIG. 4(c) are outputted. More particularly, in cycle 1, data of "I1" is written in an address of "A1", and in cycle 2, the data "I1" written in the address "A1" is read from the output terminals used for the test data output signals TD0 through TD(m−1). In cycle 3, data of "I2" is written in an address of "A2", and in cycle 4 the data "I2" in the address "A2" is read from the output terminals used for the test data output signals TD0 through TD(m−1). In the cycles 1 through 4, the output terminals for the test data output signals TD0 through TD(m−1) are selected, and the written data are read from the output terminals, the number of which is m. In that case, the outputs from the output terminals for the test data output signals TDm through TD(n−1) terminals are invalid (that is, Z (high impedance) state). In cycles 5 through 8, the test address signals and the test data input signals are the same as those in the cycles 1 though 4, but the output terminals for the output signals TDm through TD(n−1) terminals are selected. The Data written in the cycles 5 and 7 are to be outputted from the selected terminals, the number of which is (n−m). In this case, the outputs of the output terminals used for the test data output signals TD0 through TD(m−1) are invalid.

Figure 5:
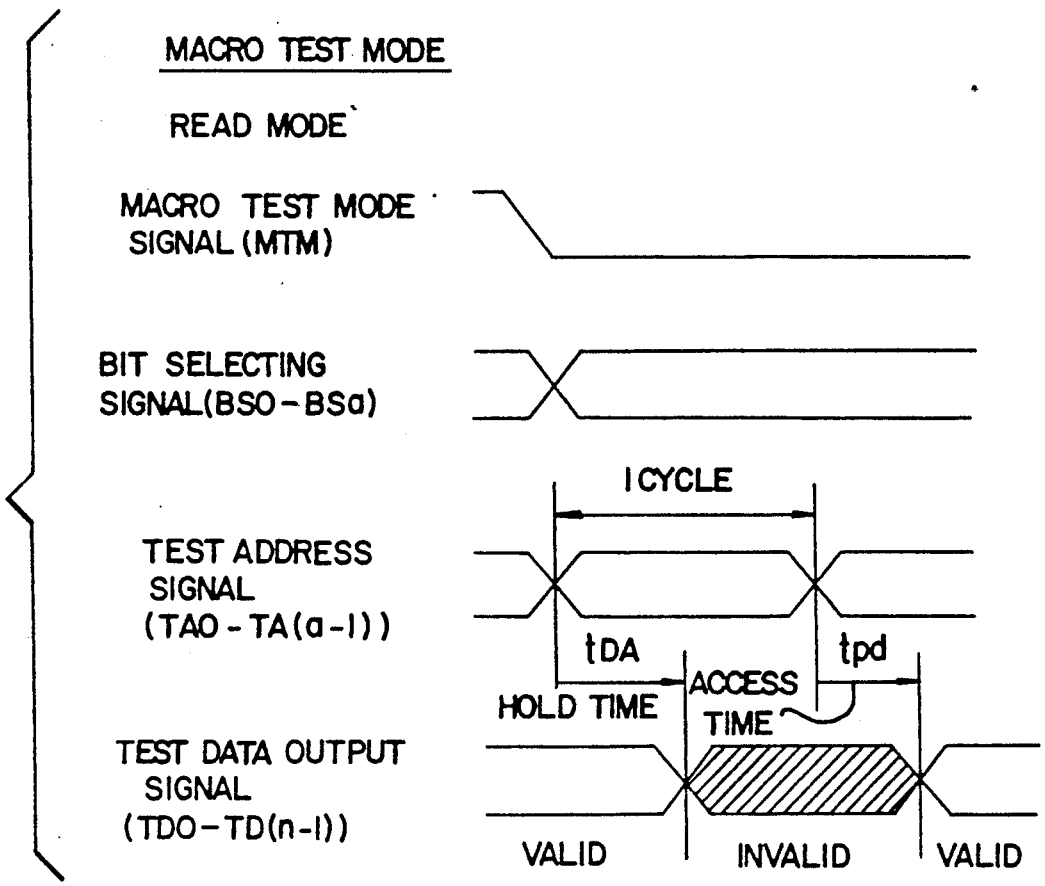
Figure 6:
Figure 6:
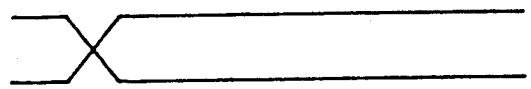
Figure 6:
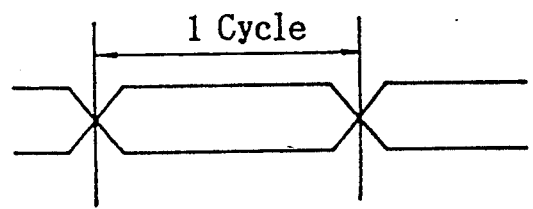
Figure 6:
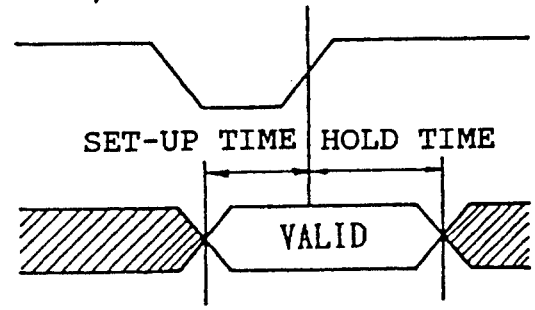
Figure 6:
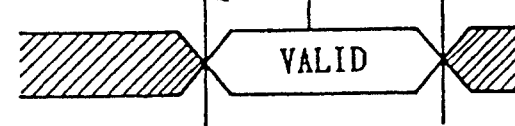
Figure 7:
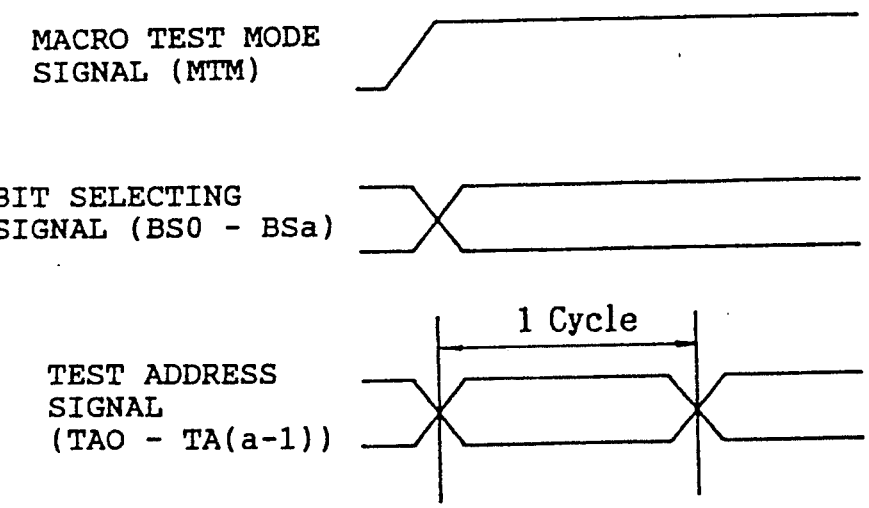

FIGS. 5 through 7 are detailed timing diagrams of FIG. 4. The read mode of the macro test mode shown in FIG. 5 represents the timings 2, 4, 6 and 8 of FIG. 4, and the write mode of the macro test mode shown in FIG. 6 represents the timings 1, 3, 5 and 7 of FIG. 4. If the macro test mode terminal is made "H", then the normal mode (user mode) is obtained as shown in FIG. 7.

As previously indicated, in the present invention, the bit width of one macro cell (in FIG. 1, the single port RAM 3) is divided to a plurality of bit widths having predetermined bits, and the one macro cell is tested as if a plurality of macro cells existed. Therefore, the number of terminals required for the macro cell test can be reduced. Particularly, if the bit width of the macro cell is divided to a large number of bit widths, the test external terminals could be greatly reduced in number.

Embodiments of the present invention will hereinafter be described in accordance with the above described basic principles.

Figure 8:
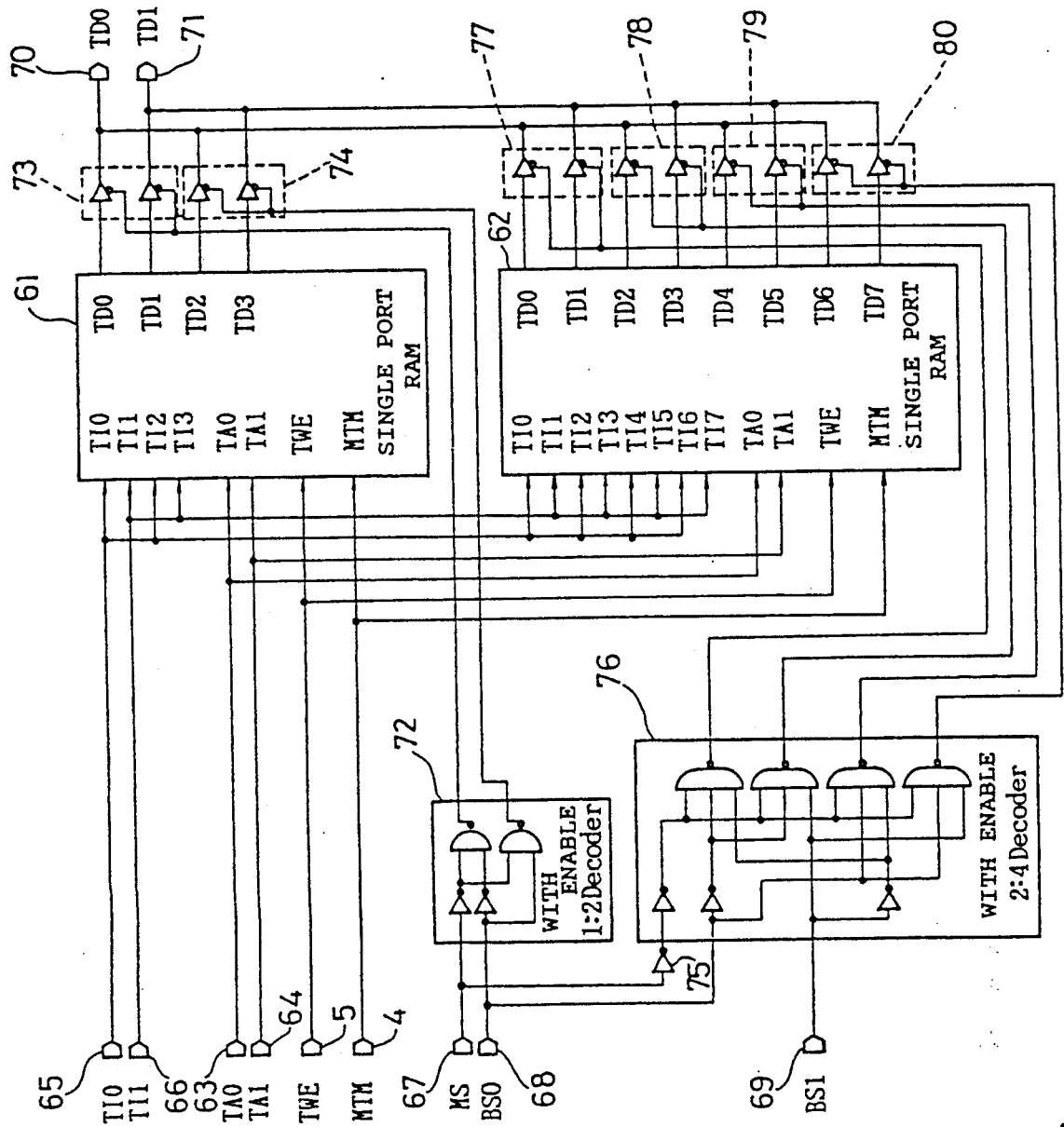
FIG. 8 is a schematic diagram of a first embodiment of a semiconductor IC device according to the present invention in which two single port RAMs are mounted.

FIG. 8 illustrates a first embodiment of the semiconductor IC device according to the present invention. This embodiment is applied to a semiconductor IC device having two single port RAMs mounted therein as macro cells. The parts of the first embodiment of FIG. 8 identical to corresponding parts of FIGS. 1–3 are designated by the same reference numerals and same reference characters.

In FIG. 8, 61 is a 4-word×4-bit single port RAM and 62 a 4-word×8-bit single port RAM. The single port RAMs 61 and 62 are connected to a random logic circuit (not shown). The connections connected to the random circuit (not shown) are not shown for clarifying the connected state of a test circuit, but they are connected as in the case of FIG. 1. 4, 5 and 63–69 are external input terminals, and 70, 71 external output terminals. To the external input terminal 4 is inputted a test mode selecting signal MTM, to the external input terminal 5 is inputted a write enable signal TWE in the test mode, and to the external input terminals 63, 64 are respectively inputted test address signals TA0 and TA1. Each of the signals MTM, TWE, TA0, and TA1 is connected to the single port RAMs 61 and 62 in parallel relationship. On the other hand, to the external input terminals 65, 66 are data input signals TI0 and TI1, each of which is connected to the divided pits of the RAMs 61 and 62 in parallel relationship. In addition, to the external input terminal 67 is inputted a macro cell selecting signal MS to select the RAM 61 or 62. To the external input terminals 68 and 69 are respectively inputted bit selecting signals BS0 and BS1. In the test mode, the bit selecting signals BS0 and BS1 are used in the bit division test. The signals MS and BS0 are outputted through a decoder 72 with an enable terminal to bus drivers 73 and 74, which select test data output signals TD0 through TD3 of the predetermined bits of the single port RAM 61. The bus drivers 73 and 74 select test data output signals TD0 through TD3 which are outputted in response to the test data input signals TI0 through TI3 which are divided every bit and inputted from the external terminals 65 and 66. The truth values of the decoder 72 with an enable terminal are shown in Table 1.

TABLE 1

| G | S1 | X1 | X0 |
|---|----|----|----|
| H | X  | H  | H  |
| L | L  | H  | L  |
| L | H  | L  | H  |

Likewise, the macro cell selecting signal MS is outputted through an inverter 75 and a decoder 76 with an enable terminal to bus drivers 77 through 80, which select test data output signals TD0 through TD7 of the predetermined bits of the single port RAM 62. The bit selecting signals BS0, BS1 are also outputted through the decoder 76 with an enable terminal to the bus drivers 77 through 80. The bus drivers 77 through 80 select the test data output signals TD0 through TD7 which are outputted in response to the test data input signals TI0 through TI7 which are divided every bit and inputted from the external terminals 65 and 66. The truth values of the decoder 76 with an enable terminal are shown in Table 2.

TABLE 2

| G | S2 | S1 | X3 | X2 | X1 | X0 |
|---|----|----|----|----|----|----|
| H | X | X | H | H | H | H |
| L | L | L | H | H | H | L |
| L | L | H | H | H | L | H |
| L | H | L | H | L | H | H |
| L | H | H | L | H | H | H |

In the construction described above, the composite semiconductor IC 1 of the embodiment has two single port RAMs 61 and 62 mounted therein, the 4-word×4-bit of the single port RAM 61 being divided to two, and the 4- word×8-bit of the single port RAM 62 being divided to four. Therefore, in the single port RAM 61, the RAM is divided to two, two inputs (2 bits) enter each of the divided RAMs, and two pairs of two outputs (2 bits) are controlled by the bit selecting signals BS0 and BS1. Also, in the single port RAM 62, the RAM is divided to four, two inputs (2 bits) enter each of the divided RAMs in parallel relationship, and four pairs of two outputs are controlled by the bit selecting signals BS0 and BS1.

Thus, in the embodiment of FIG. 8, the RAMs 61 and 62 are considered to be six 4-word×2-bit RAMs by the signals MS, BS0 AND BS1, as shown in Table 3, and then the six divided RAMs test has been tested.

TABLE 3

| MS | BS0 | BS1 | Macro cell selected | Terminal of macro cell selected | |
|----|-----|-----|---------------------|------|------|
| 0 | 0 | 0 | Single Port RAM 61 | TD 0 | TD 1 |
| 0 | 0 | 1 | Single Port RAM 61 | TD 2 | TD 3 |
| 1 | 1 | 0 | Single Port RAM 62 | TD 0 | TD 1 |
| 1 | 1 | 1 | Single Port RAM 62 | TD 2 | TD 3 |
| 1 | 1 | 0 | Single Port RAM 62 | TD 4 | TD 5 |
| 1 | 1 | 1 | Single Port RAM 62 | TD 6 | TD 7 |

In the conventional test circuit, if a plurality of macro cells are mounted in a chip and among them a macro cell having a very large bit width exists, the number of the test external terminals of the entire chip was determined by the number of terminals required to the large macro cell. However, in the present invention, when the macro cell is tested, it can be divided to a plurality of macro cells having arbitrary bit widths. Consequently, the number of the test external terminals of the chip can be reduced by dividing only the bit width of a larger macro cell. Even when only one macro cell exists or even when a plurality of various macro cells different in size exist, the number of the test external terminals of the entire chip is not very increased. In the embodiment of FIG. 8, by dividing the 8-bit single port RAM 62 to 4, 8 external terminals required to the conventional test circuit can be reduced to 2 external terminals. In fact, there are some cases where a 32-bit RAM other than a 8-bit RAM is mounted in the macro cell. In such a case, even if external terminals are used in common by providing a macro selecting function, the conventional test circuit was required to output with 32 bits. In the embodiment of FIG. 8, a RAM whose bit width is larger can obtain a greater effect.

While in the embodiment of FIG. 8 the bus driver 54 has been used, it is noted that a selector may also be used instead of the bus driver 54. In addition, instead of the decoders 72 and 76, a plurality of bit selecting signals corresponding in number to the divided cells may be provided and controlled directly. In addition, although the bit selecting signals have been 2, they can be increased to 3, 4 or over in the case that the macro cell is divided above 4. In addition, in the case that the number of divided macro cells is numerous, the number of the bit selecting signals BS can be increased and the bus driver can be decoded by the decoder.

Figure 9:
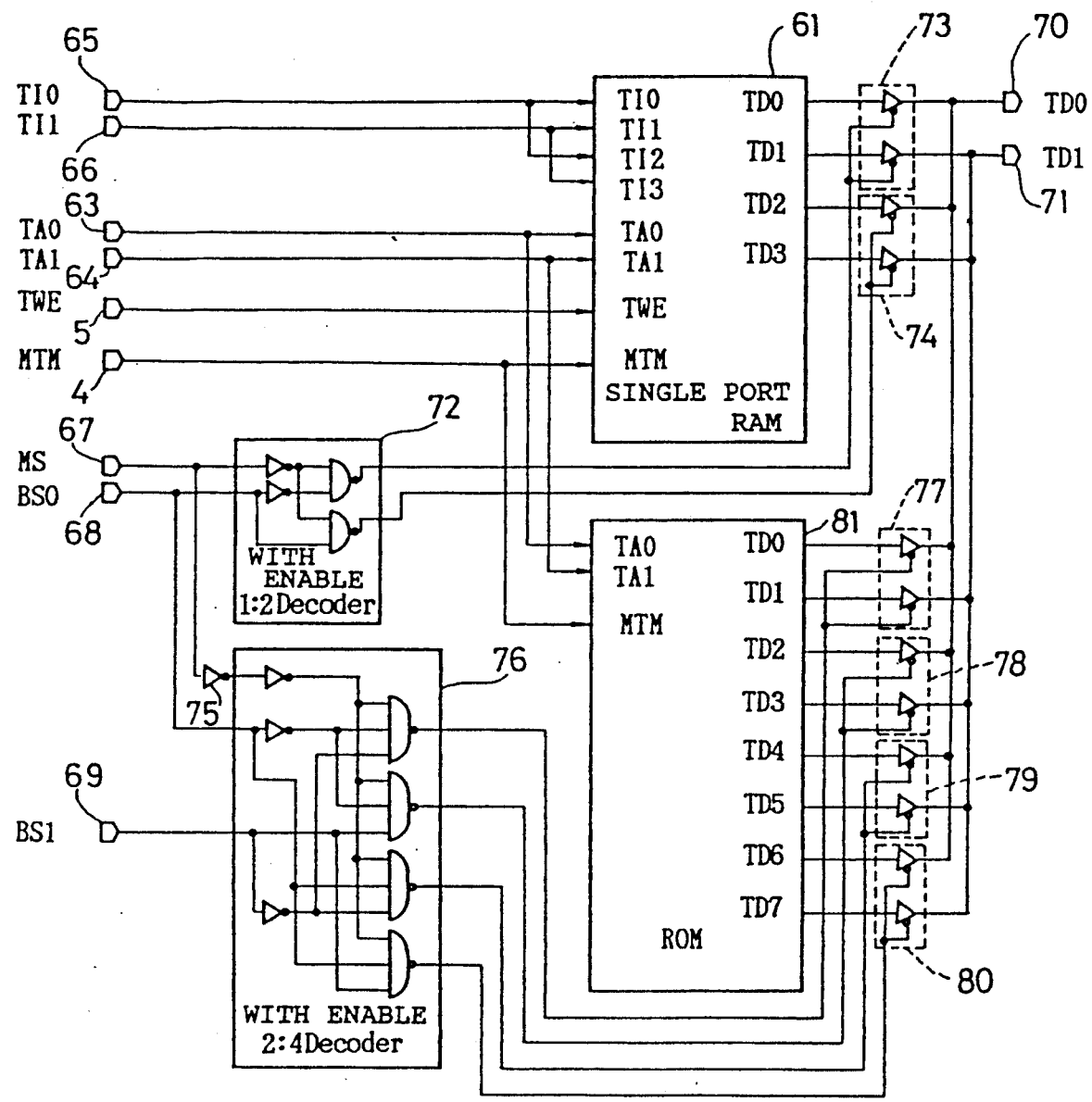
FIG. 9 is a schematic diagram of a second embodiment of a semiconductor IC device according to the present invention in which a single port RAM and a ROM are mounted.
Figure 10:
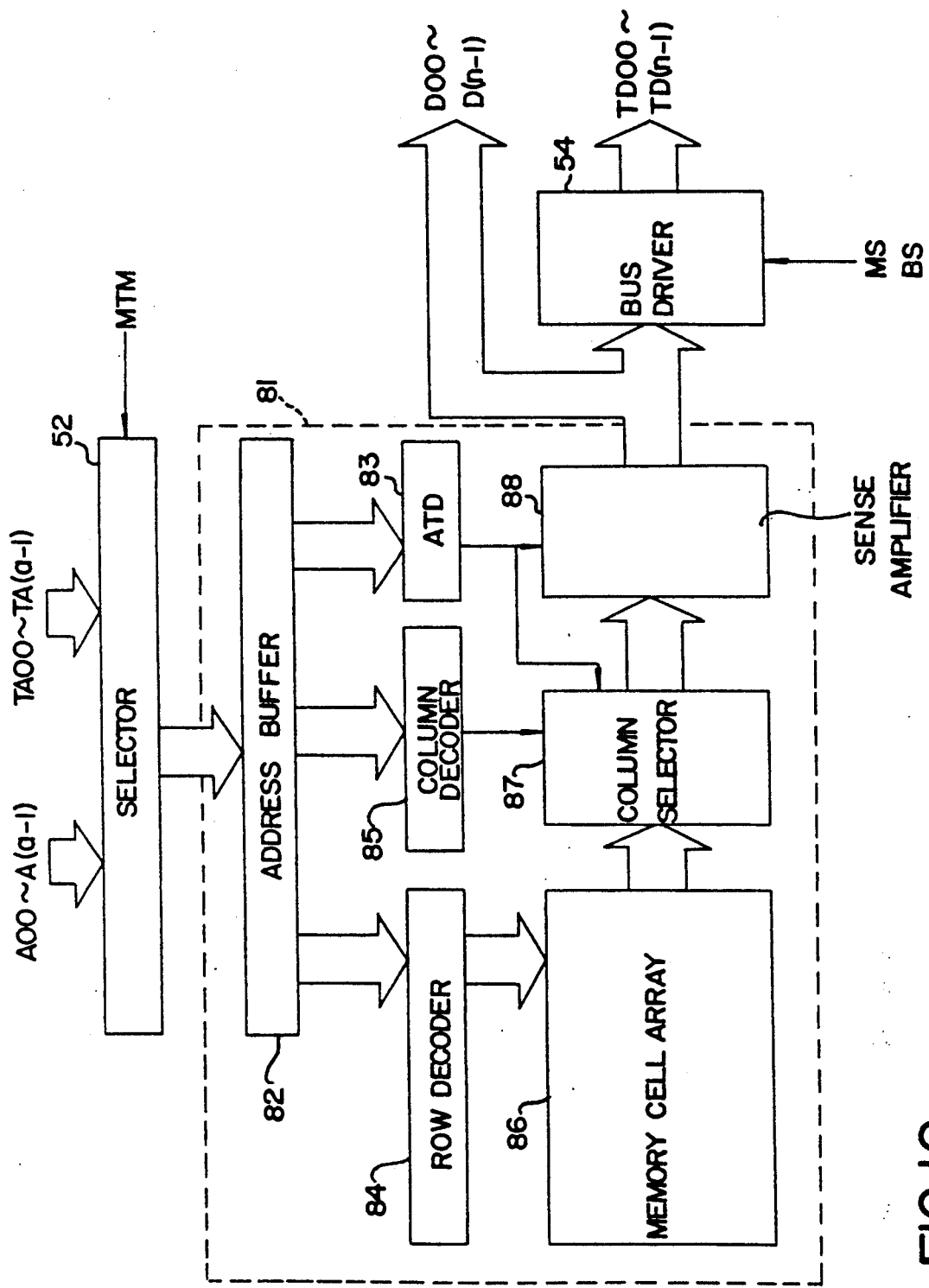
FIG. 10 illustrates the structure of the ROM of the second embodiment.

FIGS. 9 and 10 illustrate a second embodiment of the semiconductor IC device according to the present invention. This embodiment is applied to a semiconductor IC device having a single port RAM and a ROM mounted therein as macro cells. The parts of the second embodiment of FIGS. 9 and 10 identical to corresponding parts of FIGS. 1–3 and the first embodiment of FIG. 8 are designated by the same reference numerals and same reference characters and therefore a detailed description of the identical parts will not be given.

In FIG. 9, 61 is a 4-word×4-bit single port RAM, and 81 a 4- word×8-bitROM. The 4-word×4-bit of the single port RAM 61 is divided to two, and the 4-word×8-bit of the ROM 81 is divided to four. FIG. 10 is a block diagram of the ROM 81 into which a test circuit is incorporated. In FIG. 10, the ROM 81 is constituted by an address buffer 82, an address-transition detecting circuit (ATD) 83, a row decoder 84, a column decoder 85, a memory cell array 86 having memory cells arranged with a predetermined capacity in the row and column directions of a matrix, and a sense amplifier 88. Because the internal construction of the ROM 81 is well known in the prior art, a description of the ROM will not be given.

A test mode signal MTM, write enable signal TWE in the test mode, and test address signals TA0, TA1 of the macro cell are connected to the single port RAM 61 and ROM 81 in parallel relationship. Each of test data input signals TI0 and TL11 are connected to the divided pits of the single port RAM 61 in parallel relationship. In addition, bit selecting signals BS0 and BS1 in the test mode which are used in the test of bit division, and a macro cell selecting signal MS are inputted to decoders 72 and 76 with enable terminals in order to select the outputs of the single port RAM 61 and ROM 81. The table of truth value of the FIG. 9 circuit is shown in Table 4.

TABLE 4

| MS | BS0 | BS1 | Macro cell selected | Terminal of macro cell selected | |
|----|-----|-----|---------------------|------|------|
| 0 | 0 | 0 | Single Port RAM 61 | TD 0 | TD 1 |
| 0 | 0 | 1 | Single Port RAM 61 | TD 2 | TD 3 |
| 1 | 1 | 0 | ROM 81 | TD 0 | TD 1 |
| 1 | 1 | 1 | ROM 81 | TD 2 | TD 3 |
| 1 | 1 | 0 | ROM 81 | TD 4 | TD 5 |
| 1 | 1 | 1 | ROM 81 | TD 6 | TD 7 |

Therefore, in the embodiment of FIG. 9, the single port RAM 61 can be tested as two 4-word×2-bit RAMs and the ROM 81 as four 4-word×2-bit ROMs, with the aid of the signals MS, BS0, and BS1, and therefore the same effect as the first embodiment of FIG. 8 can be obtained.

Figure 11:
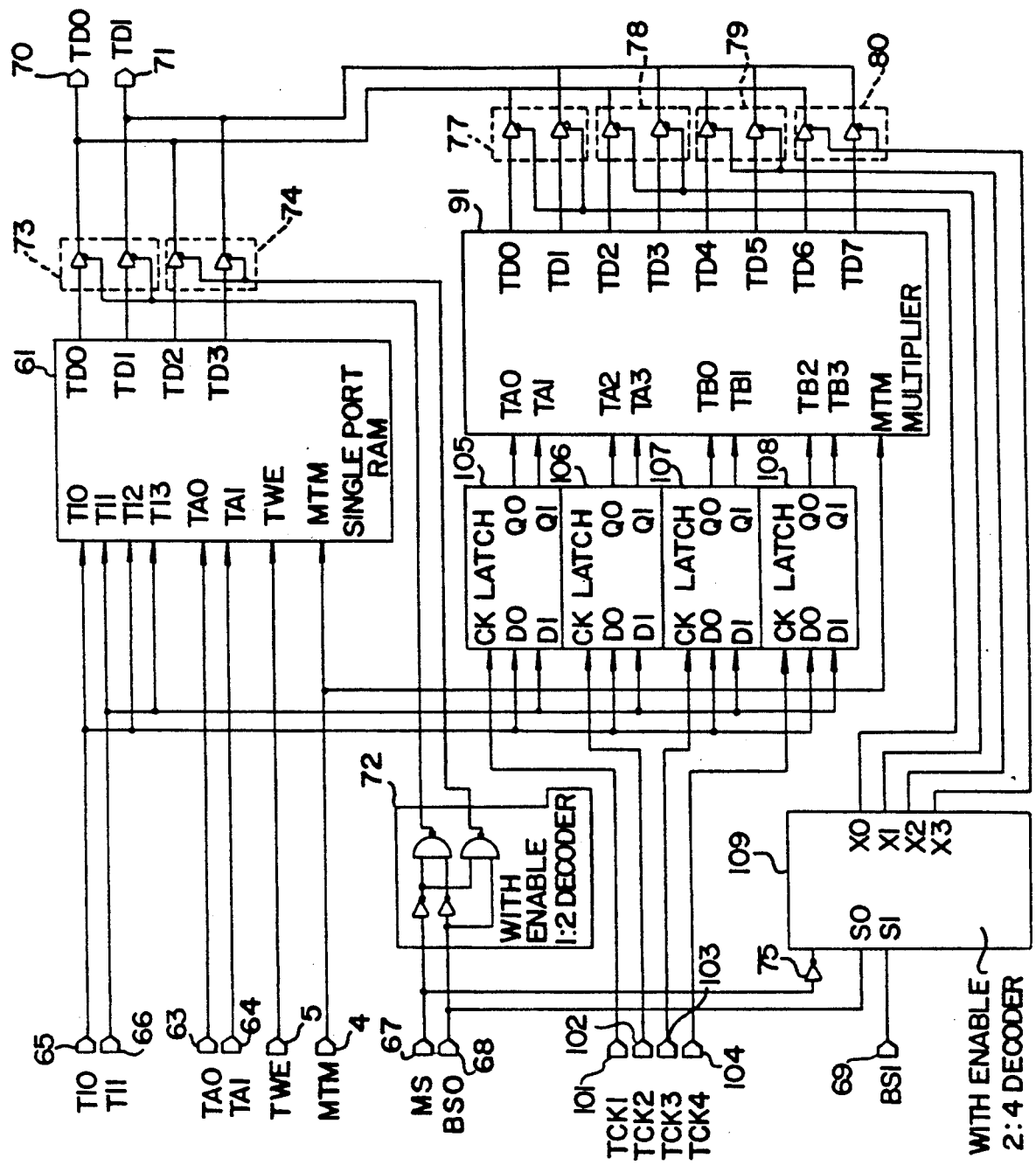
FIG. 11 is a schematic diagram of a third embodiment of a semiconductor IC device according to the present invention in which a single port RAM and a multiplier are mounted.
Figure 12:
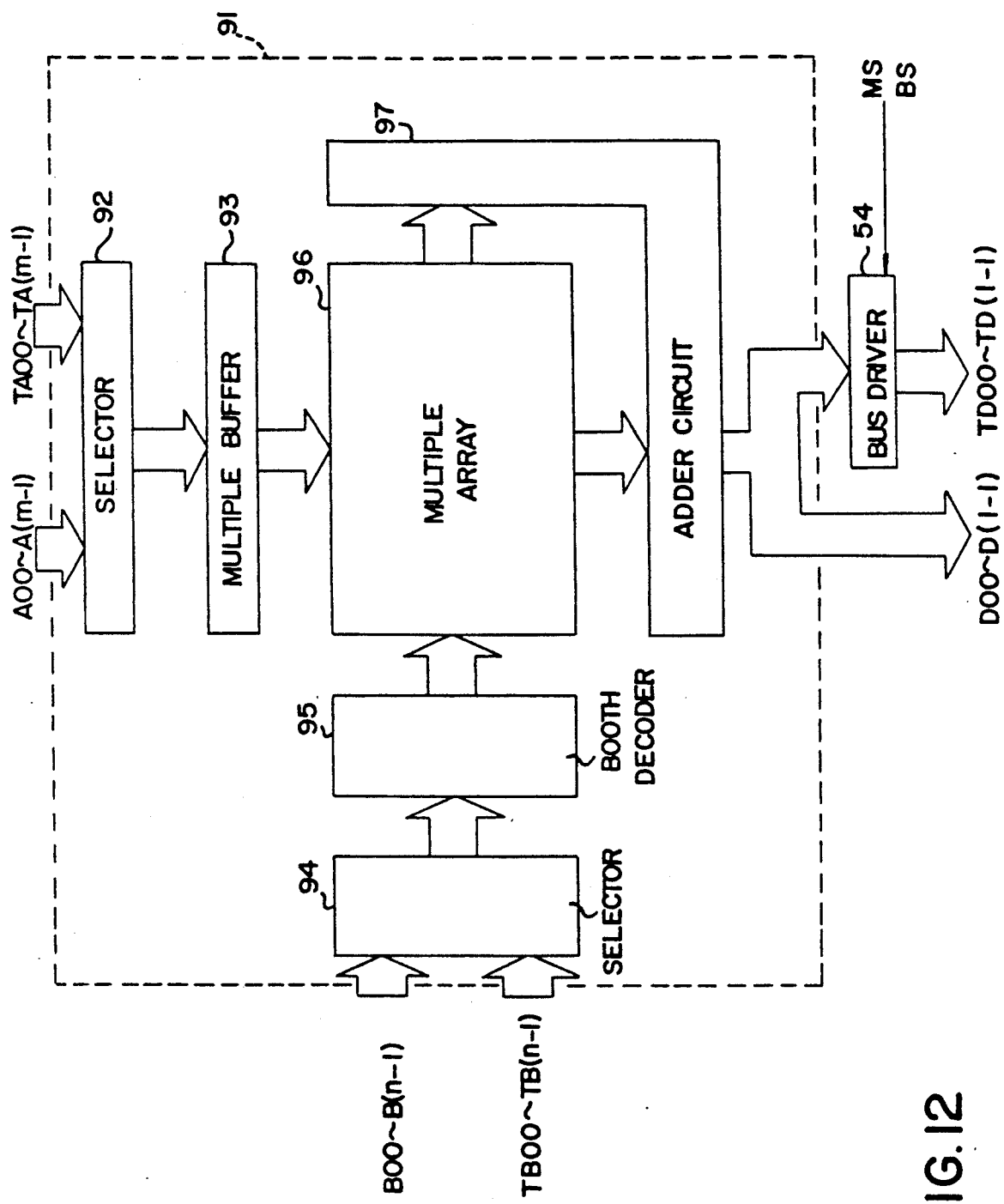
FIG. 12 illustrates the structure of the multiplier of the third embodiment.

FIGS. 11 and 12 illustrate a third embodiment of the semiconductor IC device according to the present invention. This embodiment is applied to a semiconductor IC device having a single port RAM and a multiplier mounted therein as macro cells. The parts of the third embodiment of FIGS. 11 and 12 identical to corresponding parts of FIGS. 1–3 and the first embodiment of FIG. 8 are designated by the same reference numerals and same reference characters and therefore a detailed description of the identical parts will not be given.

In FIG. 11, 61 is a 4-word×4-bit single port RAM, and 91 a 4-word×4-bit multiplier. The 4-word×4-bit of the single port RAM 61 is divided to two, and the 4-word×4-bit of the multiplier 91 is divided to four. FIG. 12 is a block diagram of the multiplier 91. The multiplier 91 comprises a selector 92 to which multiplier data A00 through A(m−1) and test multiplier data TA00 through TA(m−1) are inputted and which selects these input data in accordance with a macro test mode signal MTM, and a multibuffer 93 for buffering the input data selected by the selector 92. The multiplier 91 further comprises a selector 94 to which multiplicand data B00 through B(n−1) and test multiplicand data TB00 through TB(n−1) are inputted and which selects these input data in accordance with the macro test mode signal MTM. The multiplier 91 further comprises a booth decoder 95, a multiple array 96, and an adder circuit 97. The multiplied result from the multiplier 91 is outputted to the exterior as outputs D00 through D(l−1) of the user side, and also outputted to a bus driver 54. In accordance with a macro cell selecting signal MS and a bit selecting signal BS, the bus driver 54 outputs data of a predetermined pit to the exterior as test data outputs D00 through TD(L−1).

Returning back to FIG. 11, 101 through 104 are external terminals to which test clocks TCK1 through TCK4 are inputted, and 105 through 108 are latch circuits which latch test input data TI0 and Rsynchronously with the test clocks TCK1 through TCK4 and outputs these input data to the multiplier 91 as multipliers TA0 through TA3 and multiplicands TB0 through TB3. Unlike memory cells, it is necessary that, before input data are inputted to the multiplier 91, the multiplier 91 be controlled with the test clock signals TCK1 through TCK4 through the latch circuits 105 through 109 or flip-flop circuits.

The test mode signal MTM and test data input signals TI0 and TI1 are connected to the single port RAM 61 and the multiplier 91 in parallel relationship. Each of the test data input signals TI0 and TI1 are further connected to the divided bits of the single port RAM 61 in parallel relationship. In addition, the write enable signal TWE in the test mode and the test data input signals TA0 and TA1 are connected only to the single port RAM 61.

The macro cell selecting signal MS and bit selecting signal BS0 are outputted through a decoder 72 with an enable terminal to a bus driver 73, which selects the test data output signals TD0 through TD3 of the predetermined bits of the single port RAM 61. In addition, the macro cell selecting signal MS is inputted through an inverter 75 and a decoder 109 with an enable terminal to bus drivers 77 through 80. The bit selecting signals BS0 and BS1 are also outputted through the inverter 109 to the bus drivers 77 through 80. The bus drivers 77 through 80 select the test data output signals TD0 through TD7 of the predetermined bits of the multiplier 91. The table of truth value of the FIG. 11 circuit is shown in Table 5.

TABLE 5

| MS | BS0 | BS1 | Macro cell selected | Terminal of macro cell selected | |
|---|---|---|---|---|---|
| 0 | 0 | 0 | Single Port RAM | TD 0 | TD 1 |
| 0 | 0 | 1 | Single Port RAM | TD 2 | TD 3 |
| 1 | 1 | 0 | Multiplier | TD 0 | TD 1 |

TABLE 5-continued

| MS | BS0 | BS1 | Macro cell selected | Terminal of macro cell selected | |
|---|---|---|---|---|---|
| 1 | 1 | 1 | Multiplier | TD 2 | TD 3 |
| 1 | 1 | 0 | Multiplier | TD 4 | TD 5 |
| 1 | 1 | 1 | Multiplier | TD 6 | TD 7 |

Therefore, in the embodiment of FIG. 11, the single port RAM 61 can be tested as two 4-word×2-bit RAMs and the multiplier 91 as four 2-bit multipliers, with the aid of the signals MS, BS0, and BS1. In case of a ALU (arithmetic and logic unit), the number of the terminals can be reduced in the same way as the multiplier 91.

Figure 13:
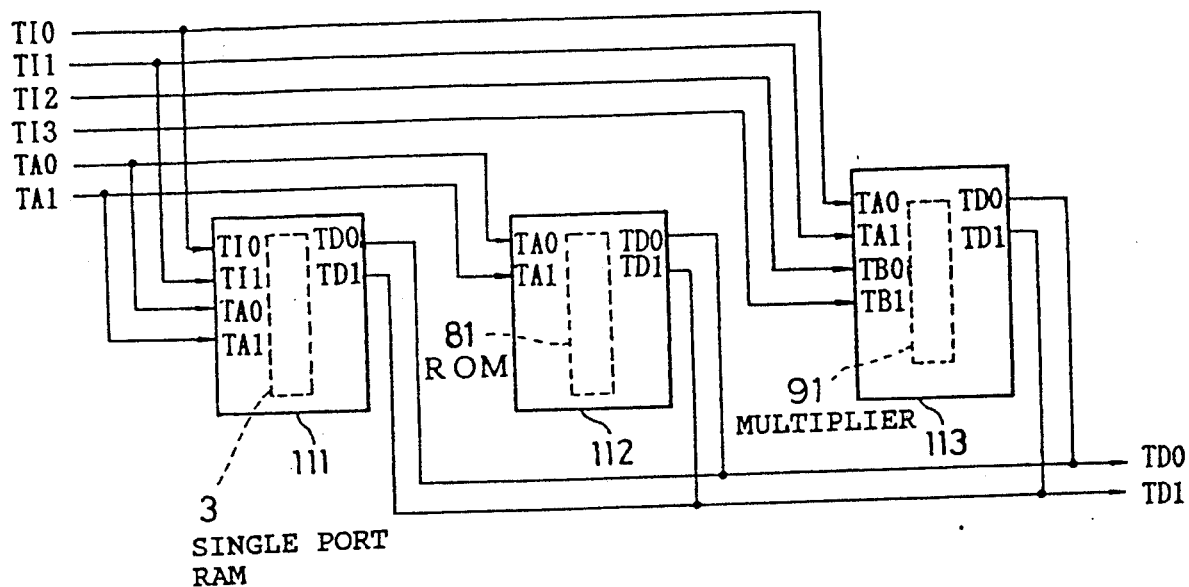
FIG. 13 is a schematic diagram of a fourth embodiment of a semiconductor IC device according to the present invention in which a single port RAM, a ROM and a multiplier are mounted.

Although in the above described embodiments of FIGS. 8, 9 and 11 the macro cells comprise two macro cells, the present invention is not limited to these embodiments. For example, as shown in the fourth embodiment of FIG. 13, the macro cells can be increased above two by increasing the number of macro cell selecting signals. In FIG. 13, test data input signals TI0 through TI3 and test address input signals TA0 through TA2 are connected to a test circuit built-in single port RAM 111, a test circuit built-in ROM 112 and to a test circuit built-in multiplier 113, in order to obtain test data output signals TD0 and TD1. In that case, each of the test address input signals TA0 and TA1 are connected to the macro cells 111 and 112, but the signals TA0 and TA1 are not connected in case of macro cells having no address terminals (multipliers, ALUs, etc.), as shown in FIG. 13.

In addition, in each embodiment described above, the bit width has been 2 bits, but it is not limited to 2 bits. In addition, the bit width of the macro cell may be divided to different bit widths. For example, in the case that a 256-word×36-bit RAM is divided with a unit of 8 bits, it may be divided to four 256-word×8-bitRAMs and a 256-word×4-bit RAM. In addition, although each of the macro cells 111, 112 and 113 has its test circuit incorporated therein, the test circuit may be provided outside the macro cell.

Figure 14:
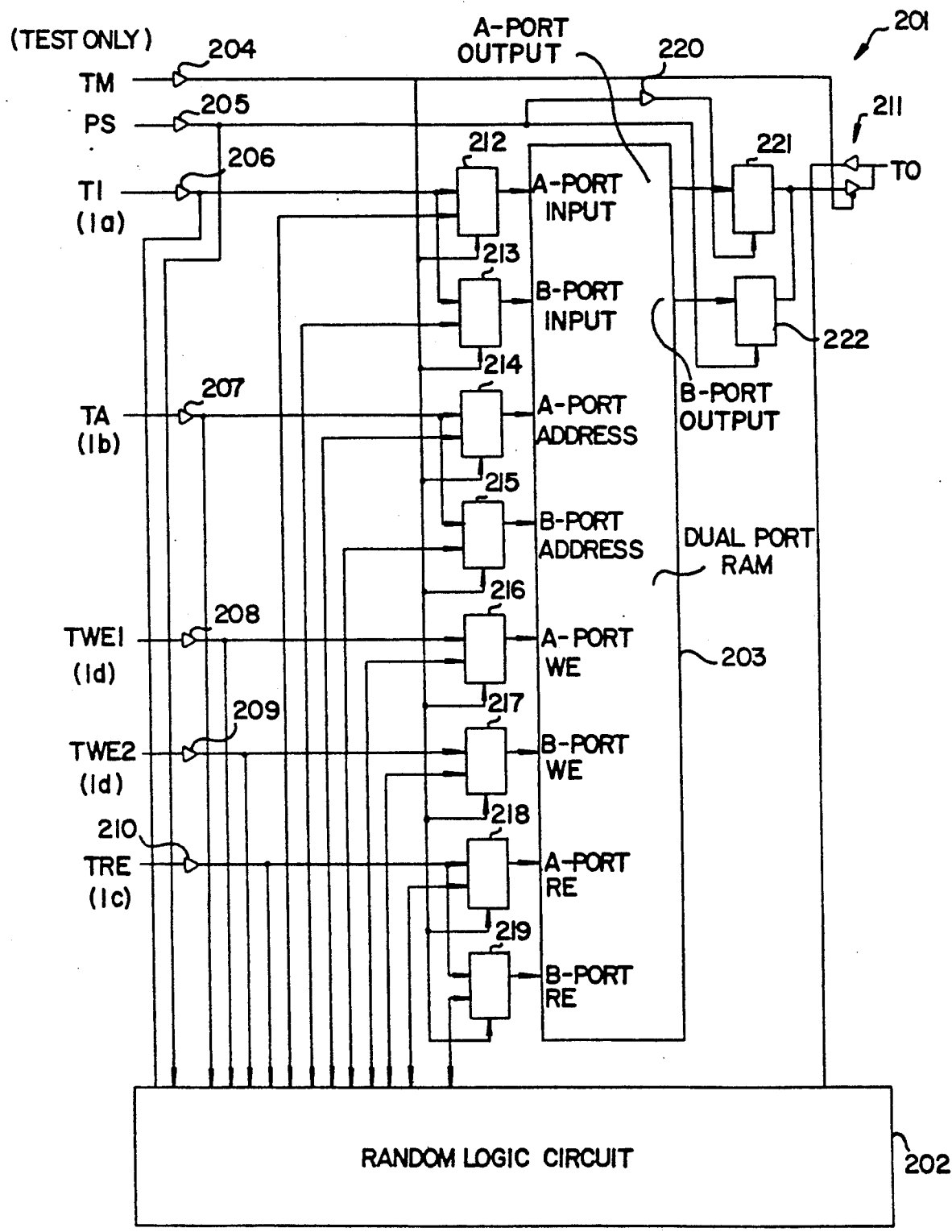
FIG. 14 is a schematic diagram used to explain the basic principles of the present invention which is applied to a semiconductor IC device in which a random logic circuit and a dual port RAM are mounted together.

FIGS. 14 through 18 are diagrams used to explain the basic principles of the present invention which is applied to a semiconductor IC device in which a random logic circuit and a multiport memory are mounted together. The basic principles will be explained with respect to a dual port RAM, although there are various kinds of multiport memories. In FIG. 14, reference numeral 201 denotes a semiconductor IC device, which is constituted by a random logic circuit 202, a dual port RAM (multiport memory) 203, test input terminals 204 through 210, a test output terminal 211, input selectors 212 through 219, an inverter 220, and output-port selectors 221, 222.

To the test input terminals 204 through 210 are respectively inputted a test mode signal TM, a port selecting signal PS, a test data input signal TI(1a), a test address signal TA(1b), test write enable signals TWE1(1d), TWE2(1d), and a test RAM enable signal TRE(1c). From the test output terminal 211 is outputted a test data output signal TO.

Figure 15:
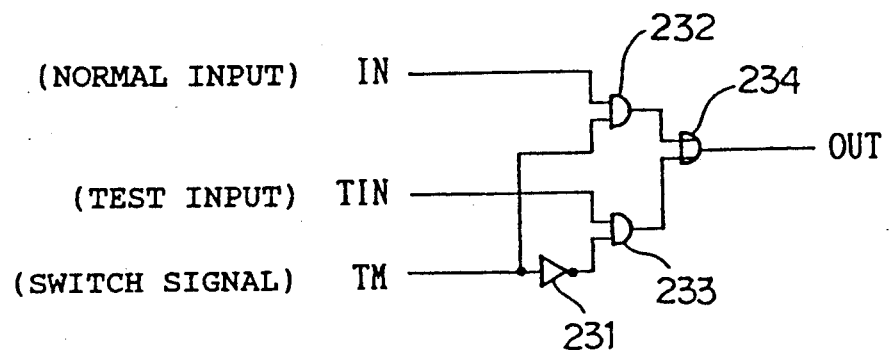
FIG. 15 is a circuit diagram of the input selector of FIG. 14.

When the dual port RAM 203 is in normal operation, the random logic circuit 202 is connected with the RAM 203 so that data are exchanged therebetween. When the dual port RAM 203 is tested, the random logic circuit 202 is disconnected from the RAM 203. The dual port RAM 203 has two input terminals, output terminals, address terminals, write enable terminals, and RAM enable terminals for A-ports and B-ports. The terminals of the dual port RAM 203 can be controlled directly from the exterior of the LSI by the test mode signal TM outputted from the test input terminal 204. Each of the input selectors 212 through 219 selects normal operation or test operation about the input to the RAM 203, and is controlled by the test mode signal TM. Each test input signal other than the test enable signals is connected to the A-port and B-port to reduce the number of the terminals. FIG. 15 illustrates the structure of the input selectors 212 through 219. In FIG. 15, 231 denotes an inverter, and 232, 233 denote AND gates. 234 denotes an OR gate.

Figure 16:
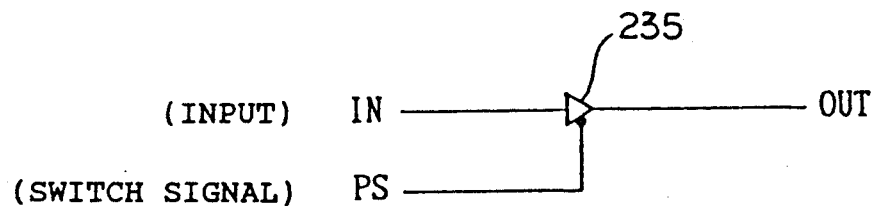
FIG. 16 is a circuit diagram of the output-port selector of FIG. 14.

The output-port selectors 221 and 222 select one port from the output ports of the dual port RAM 203 in accordance with the port selecting signal PS, in order to reduce the number of the terminals. The output result of the RAM 203 is transmitted to the test output terminal 211. FIG. 16 illustrates the structure of the output-port selectors 221 and 222. Each output-port selector has a switching gate 235. When the dual port RAM is in test mode, the test input terminals 204 through 210 and the test output terminal 211 are connected to the dual port RAM 203, and in normal state, the terminals 204 through 211 are connected to the random logic circuit 202. In some cases, it is determined if the terminals 204 through 211 are used as test terminals, by the test mode signal TM.

Each of the test data input signal 1a, test address signal 1b and test RAM enable signal 1c is connected to the A-port and B-port in parallel relationship. The test write enable signals 1d and 1d are connected to the A-port and B-port, respectively. The output terminals of the A-port and B-port of the dual port RAM 203 are connected to the output-port selectors 221 and 222, respectively.

Figure 17:
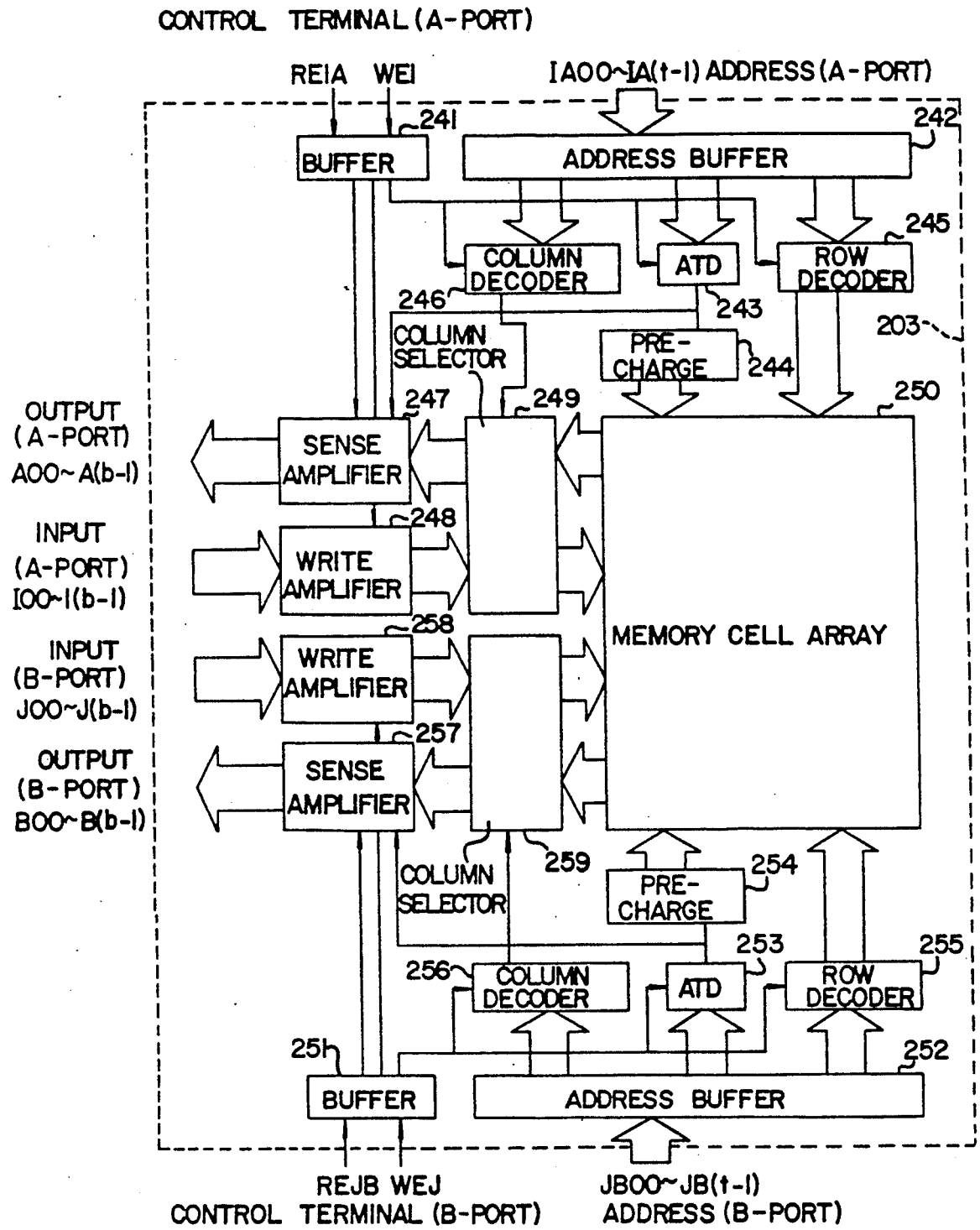
FIG. 17 illustrates the structure of the dual port RAM of FIG. 14.

FIG. 17 is a block diagram showing the dual port RAM 203 which comprises largely an A-port part and a B-port part. The A-port part is constituted by a buffer 241, an address buffer 242, an address-transition detecting circuit (ATD) 243, a pre-charge circuit 244, a row decoder 245, a column decoder 246, a sense amplifier 247, a write amplifier 248, a column selector 249, and a memory cell array 250 having memory cells arranged with a predetermined capacity in the row and column directions of a matrix. Likewise, the B-port part is constituted by a buffer 251, an address buffer 252, an address-transition detecting circuit (ATD) 253, a pre-charge circuit 254, a row decoder 255, a column decoder 256, a sense amplifier 257, a write amplifier 258, a column selector 259, and the memory cell array 250. Therefore, a detailed description of the A-port part will hereinafter be described. A test write enable signal WEI to write and read data from a control terminal (A-port) is buffered by the buffer 241 and outputted to the row decoder 245, column decoder 246, sense amplifier 247 and to the write amplifier 248. External addresses IA00 through IA(t−1) of the A-port in which row addresses and column addresses are multiplexed are buffered by the address buffer 242, and outputted to the address-transition detecting circuit 243, row decoder 245 and column decoder 246. The address-transition detecting circuit 243 detects the address transition of the external addresses outputted from the address buffer 242 and outputs it to the pre-charge circuit 244 and sense amplifier 247. In accordance with the detected result, the pre-charge circuit 244 precharges the data line of the memory cell array 250. The row decoder 245 decodes the transmitted external addresses or internal addresses, and, according to this decoded result, selects and activates one of a large number of word lines of the memory cell array 250. The column decoder 246 decodes the transmitted external addresses and outputs them to the column selector 249. The write amplifier 248 buffers external input data 100 through I(b−1), and outputs these data to the column selector 249, which selects one of the bit lines of the memory cell array 250 in response to the decoded result from the column decoder 246. The sense amplifier 247 amplifies the electric potential of the bit line that has been selected through the column selector 249, and reads out data A00 through A(b−1) of the memory cell 250 connected to the selected bit line. The operations described above are the same in the B-ports.

The internal construction of the dual port RAM 203 shown in FIG. 17 is the same construction as the prior art, but the dual port RAM 203 is different from the prior art in a method for connecting test input and output terminals to the dual port RAM 203. That is, IA00 through IA(t−1) addresses (A-port) and JB00 through JB(t−1) addresses (B-port) are connected in common, and REIA (A-port) and REJB (B-port) are also connected in common. A write enable signal WEI (A-port) and a write enable signal WEJ (B-port) are independent from each other.

Figure 18:
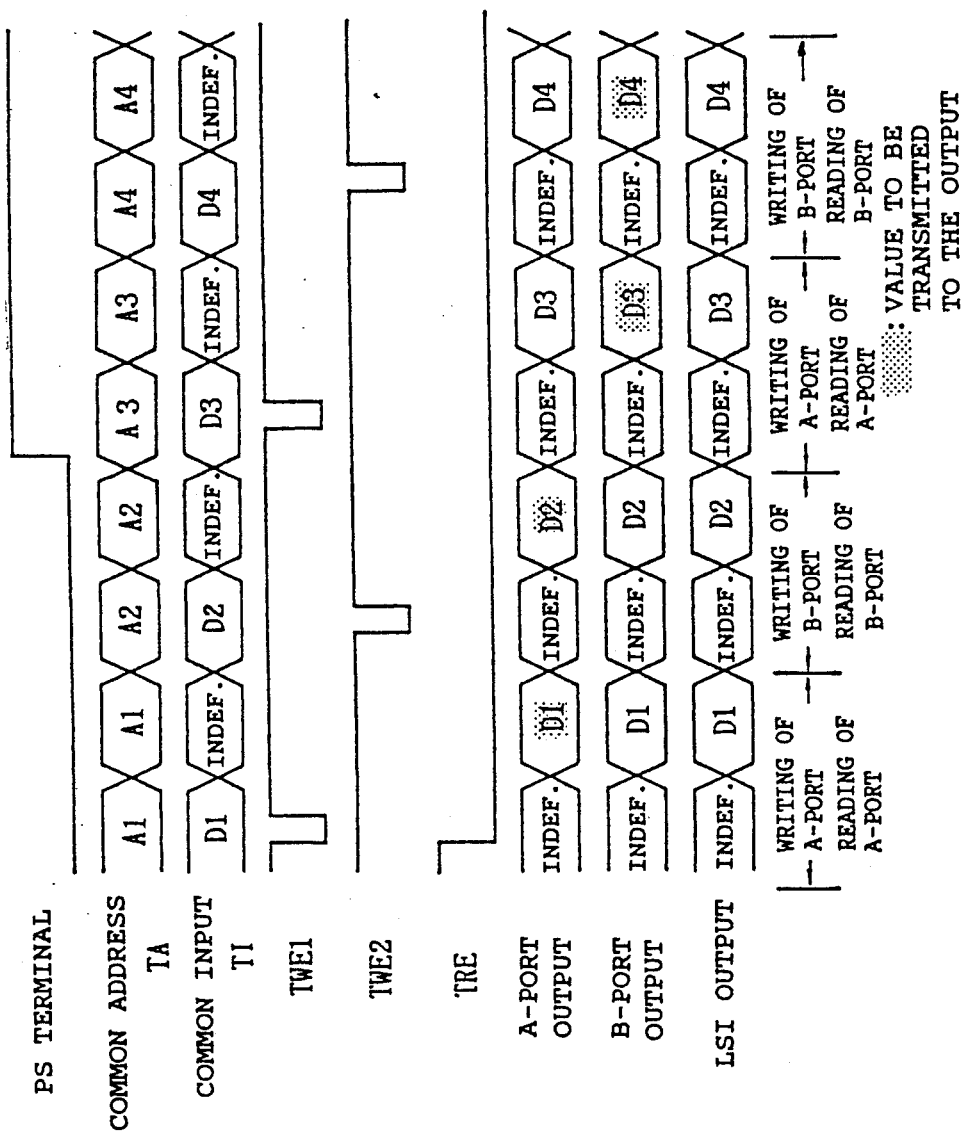
FIG. 18 is a timing diagram of the structure shown in FIG. 14.

FIG. 18 is a timing diagram of test data which show the input waveforms inputted from the external terminals and the output waveforms outputted from the dual port RAM 203. In FIG. 18, a common address is TA, and a common input is TI. Common addresses A1 through A4 are combinations of "0" and "1", and comprise four pairs of identical addresses. The "indefiniteness" in the common input TI is intended to mean that it may be any value.

The writing of the A-port is performed by the test write enable signal TWE1, and in FIG. 18, the writing of the A-port has been performed two times. For the B-port, the writing has been performed at different times by the test write signal TWE2.

For example, data D1 is inputted from the A-port. The reading of the A-port is performed when the write enable signal TWE1 has retuned to "H", and the common address remains A1, as shown in FIG. 18. Therefore, the data D1 is outputted from the A-port and also from the LSI through the output terminal 211. If the common address is changed to A2 and data D2 is inputted from the B-port, then the data D2 is outputted from the A-port since the common address remains A2. Because in the above example the A-port has been selected by the port selecting signal PS, the output from the A-port is selected. If the port selecting signal PS is inverted, then the output from the B-port is selected. Table 6 shows which port is selected with respect to the signals PS, TWE1 and TWE2.

TABLE 6

| PS | Write enable signal TWE1 | Write enable signal TWE2 | Write port | Read port |
|---|---|---|---|---|
| L | Pulse | H | A-port | A-port |
| L | H | Pulse | B-port | A-port |
| H | Pulse | H | A-port | B-port |
| H | H | Pulse | B-port | B-port |

The test method will hereinafter be described.
(1) Setting of the test mode

By making "L" the test mode signal TM supplied from the outside, the built-in RAM 203 is disconnected from the random logic circuit 202, and the common test terminals are set to a test state.

(2) Selection of the ports to be tested

A read port is selected by the selecting signal PS supplied from the outside. In addition, a write port is selected by the test write enable signal TWEn. The combinations of the ports to be tested are shown in Table 6.

(3) Execution of the test

Since the multiport RAM 203 can be considered to be a single port RAM by performing the steps (1) and (2), the test is executed with a test pattern for a single port RAM. if the test is completed about one combination of the ports, the test is then repeated about different port combinations selected by the step (2). In this way, all of the port combinations are tested.

By selecting the above described test circuit and the enable terminals of the RAM in accordance with Table 6, it becomes possible to test one dual port RAM 203 as four single port RAMs. Embodiments of the present invention will hereinafter be described in accordance with the above described principles.

Figure 19:
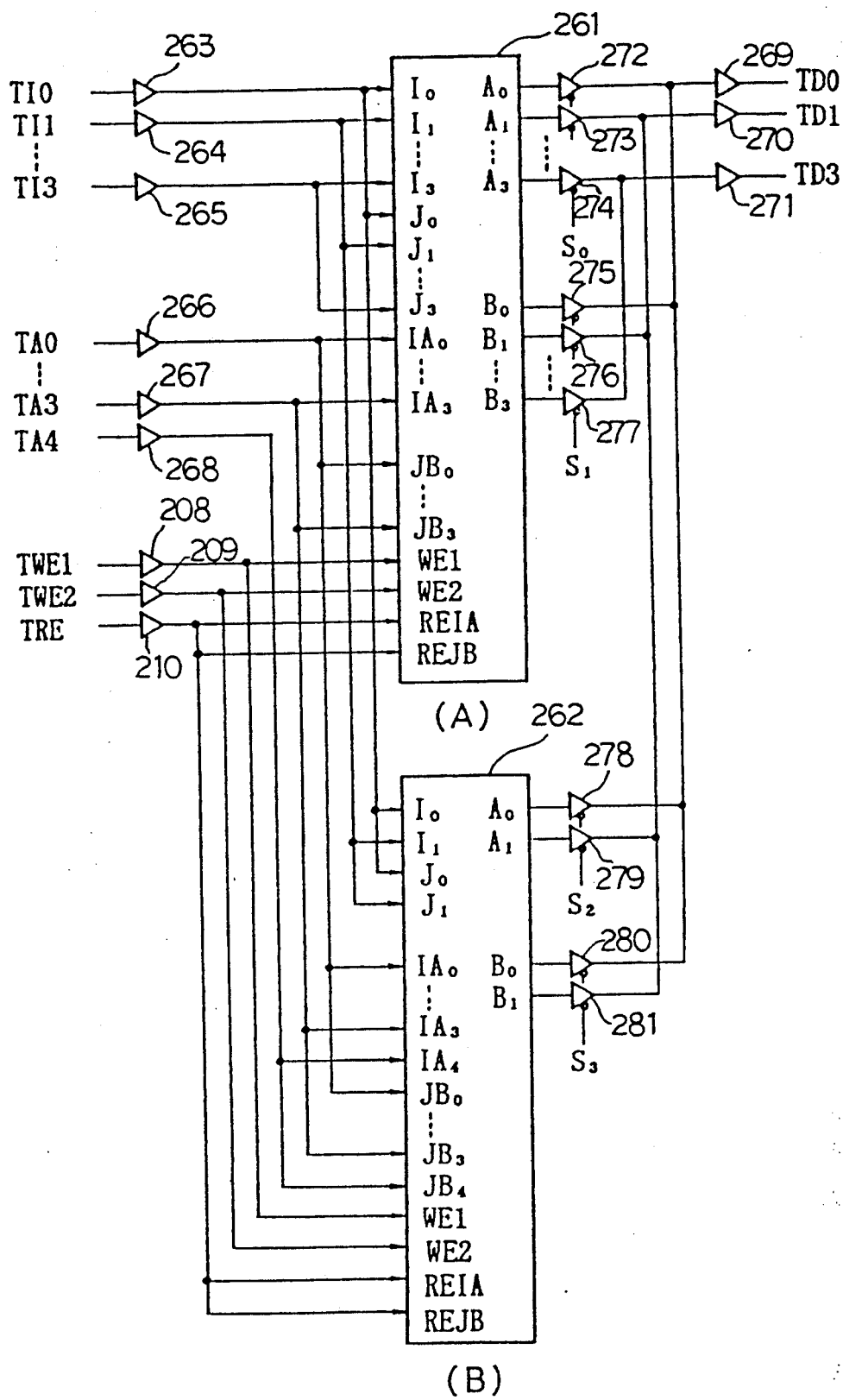
FIG. 19 is a schematic diagram of a fifth embodiment of a semiconductor IC device according to the present invention in which two dual port RAMs are mounted.
Figure 20:
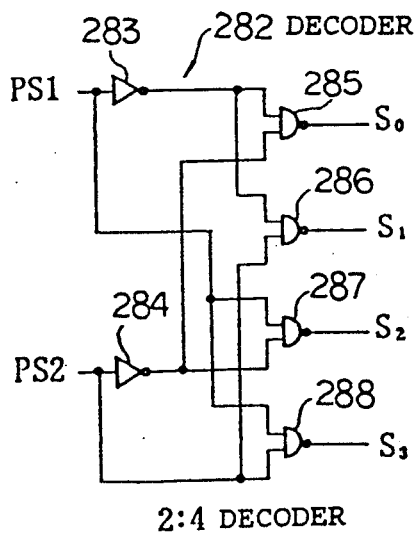
FIG. 20 is a circuit diagram of the decoder of FIG. 19.

FIGS. 19 and 20 schematically illustrate a fifth embodiment of the semiconductor IC device according to the present invention. This embodiment is applied to a semiconductor IC device in which a 16-word×4-bit dual port RAM (A) and a 32-bit×2-bit dual port RAM (B) are mounted as multiport memories. The parts of the fifth embodiment of FIGS. 19 and 20 identical to corresponding parts of FIGS. 14 through 17 are designated by the same reference numerals and same reference characters and therefore a detailed description of the identical parts will not be given.

In FIG. 19, 261 is a 16-word×4-bit dual port RAM (A) and 262 a 32-bit×2-bit dual port RAM (B). The dual port RAMs 261 and 262 are connected to a random logic circuit (not shown). Although the results other than a test circuit, and MM terminals are not shown for making clear the connected state of the test circuit, the connection lines are connected as in the case of FIG. 14. In FIG. 19, reference numerals 208 through 210 and 263 through 268 denote external input terminals, and reference numerals 269 through 271 denote external output terminals. To the external input terminals 263 through 265 are respectively inputted test data input signals TI0 through TI3. To the external input terminals 266 through 268 are respectively inputted test address signals TA0 through TA4. These signals TI0 through TI3 and TA0 through TA4 are connected to all the ports (in this embodiment, A-ports and B-ports of the dual port RAMs 261 and 262) in parallel relationship. In addition, to the test input terminals 208 through 210 are respectively inputted test write enable signals TWE1, TWE2 and a test RAM enable signal TRE. Each of the signals TWE1, TWE2 and TRE is connected to the dual port RAMs 261 and 262 in parallel relationship. The bits $A_0$ through $A_3$ of the A-ports of the dual port RAM 261 are connected through port selectors 272 through 274 to the external output terminals 269 through 271, respectively. The bits $B_0$ through $B_3$ of the B-ports of the dual port RAM 261 are connected through port selectors 275 through 277 to the external output terminals 269 through 271, respectively. Likewise, the bits $A_0$ and $A_1$ of the A-ports and bits $B_0$ and $B_2$ of the B-ports of the dual port RAM 262 are connected through port selectors 278 through 281 to the external output terminals 269 through 271, respectively. Therefore, the test data input signals TI0 through TI3, test address signals TA0 through TA4 and test write enable signal TRE of the dual ports RAMs 261 and 262 are connected to both the A-ports and the B-ports of each dual port RAM. In addition, the outputs of the A-ports and B-ports of the dual port RAMs 261 and 262 are outputted through the port selectors 272 through 281 from the external output terminals 269 through 271, as test data output signals TD1 through TD3. Note that the test write enable signals TWE1 and TWE2 are independently provided every port of the dual port RAMs 261 and 262. Control signals $S_0$ through $S_3$ to be supplied to the port selectors 272 through 281 are produced by the decoder 282 shown in FIG. 20 in accordance with output-port selecting signals PS1 and PS2. FIG. 20 is a circuit diagram of the decoder 282 which produces the control signals PS1 and PS2. In FIG. 20, 283 and 284 denote inverters and 285 through 288 NAND gates.

TABLE 7

| PS1 | PS2 | Write enable signal TWE1 | Write enable signal TWE2 | Tested RAM | Write port | Read port |
|---|---|---|---|---|---|---|
| L | L | Pulse | H | A | A-port | A-port |
| L | L | H | Pulse | A | B-port | A-port |
| L | H | Pulse | H | A | A-port | B-port |
| L | H | H | Pulse | A | B-port | B-port |
| H | L | Pulse | H | B | A-port | A-port |
| H | L | H | Pulse | B | B-port | A-port |
| H | H | Pulse | H | B | A-port | B-port |
| H | H | H | Pulse | B | B-port | B-port |

Table 7 shows the relationship between the output-port selecting signals PS1, PS2 and the ports corresponding with the combination of the test write enable signals TWE1, TWE2. In Table 7, the tested RAM A and RAM B represent the dual port RAMs 261 and 262, respectively. Therefore, if in accordance with the combinations shown in Table 7 the test signals PS1, PS2, TWE1 and TWE2 are supplied to the test external terminals of the dual port RAMs 261 and 262 and all the combinations are tested, the 16-word×4-bit dual port RAM 261 and 32-word×2-bit dual port RAM 262 can be tested as a combination of two 16-word×4-bit single port RAMs and two 32-word×2-bit single port RAMs. Since in that case a test pattern required is only data for a 16-word×4-bit single port RAM and 32-word×2-bit single port RAM, the number of the test terminals can be greatly reduced. As previously indicated, the test write enable signals are independently provided every port, and therefore the number of the signals is increased as the number of the ports increases. However, the number of the other test external terminals can be decreased to about half by testing the dual port RAM as single port RAMs. Particularly, since the number of the test external terminals of the entire chip hardly increases even if the number of the built-in memories is increased, the embodiment of FIG. 19 is well suited in the case that a plurality of memories exist within the chip.

Figure 21:
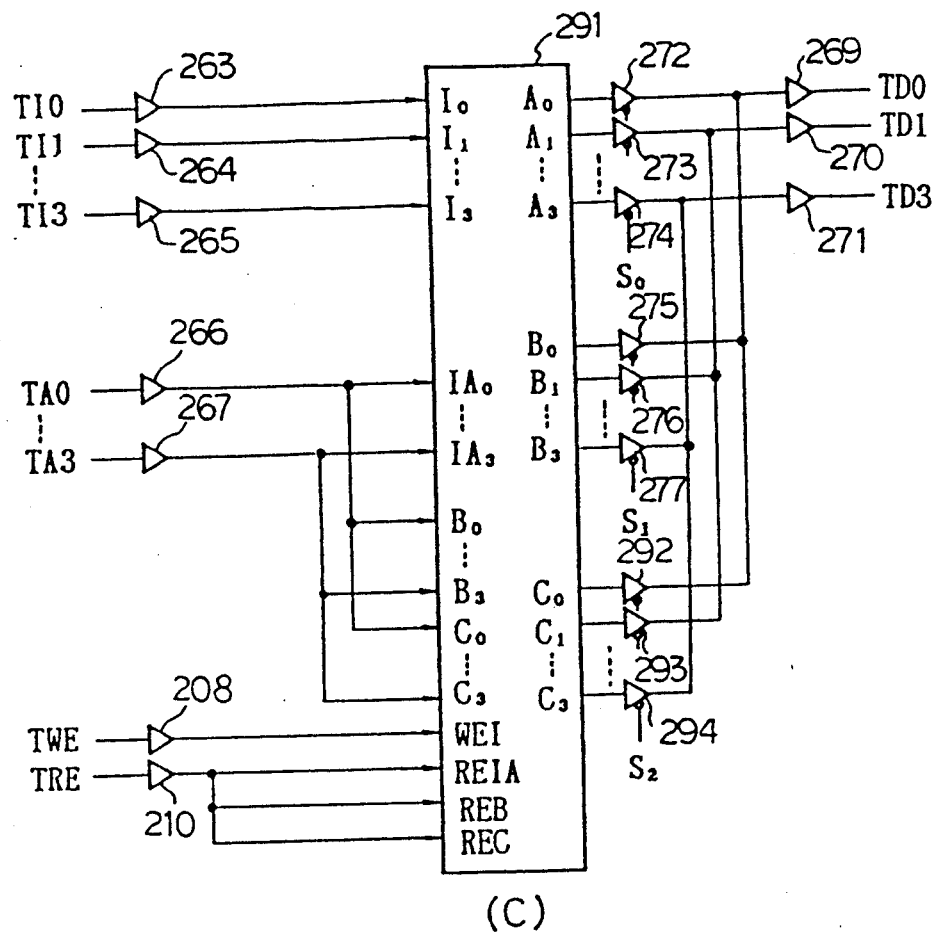
FIG. 21 is a schematic diagram of a sixth embodiment of a semiconductor IC device according to the present invention in which a three-port RAM is mounted.
Figure 22:
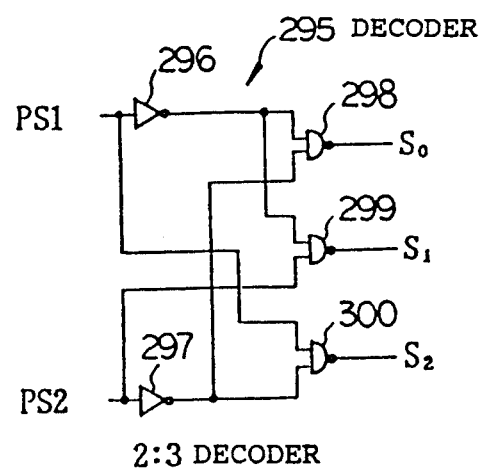
FIG. 22 is a circuit diagram of the decoder of FIG. 21.

FIGS. 21 and 22 schematically illustrate a sixth embodiment of the semiconductor IC device in accordance with the present invention. In this embodiment, a 16-word×4-bit three-port RAM (C) is employed as a multiport RAM. The parts of the embodiment of FIGS. 21 and 22 identical to corresponding parts of the fifth embodiment of FIGS. 19 and 20 are designated by the same reference numerals and same reference characters and therefore a detailed description of the identical parts will not be given.

In FIG. 21, 291 is a 16-word×4-bit three-port RAM (multiport RAM), which is connected to a random logic circuit (not shown). Test data input signals TI0 through TI3 are connected to the three-port RAM 291, and test address signals TA0 through TA3 are connected to all ports of the three-port RAM 291 (in this embodiment, A-ports, B-ports and C-ports) in parallel relationship. A test write enable signal TWE is connected to the three-port RAM 291, and a test RAM enable signal TRE is independently connected to the A-port, B-port and C-port. The bits $A_0$ through $A_3$ of the A-ports are connected through port selectors 272 through 274 to external output terminals 269 through 271, respectively. The bits $B_0$ through $B_3$ of the B-ports are connected through port selectors 275 through 277 to the external output terminals 269 through 271, respectively. The bits $C_0$ through $C_3$ of the C-ports are connected through port selectors 292 through 294 to the external output terminals 269 through 271, respectively. Control signals $S_0$ through $S_3$ to be supplied to the port selectors 272 through 277 and 292 through 294 are produced by the decoder 295 shown in FIG. 22 in accordance with output-port selecting signals PS1 and PS2. In FIG. 22, 296 and 297 denote inverters and 298 through 300 denote NAND gates.

The test write enable signal TWE required to the embodiment of FIG. 19 is one, and the relationship of the ports by a combination of the output-port selecting signals PS1 and PS2 is shown in Table 8. Therefore, the 16-word×4-bit three-port RAM can be tested as 16-word×4-bit single port RAMs. Consequently, the number of the external terminals can be greatly reduced.

TABLE 8

| PS1 | PS2 | Write enable signal TWE | Write port | Read port |
|---|---|---|---|---|
| L | L | Pulse | A-port | A-port |
| L | H | Pulse | A-port | B-port |
| H | L or H | Pulse | A-port | C-port |

Figure 23:
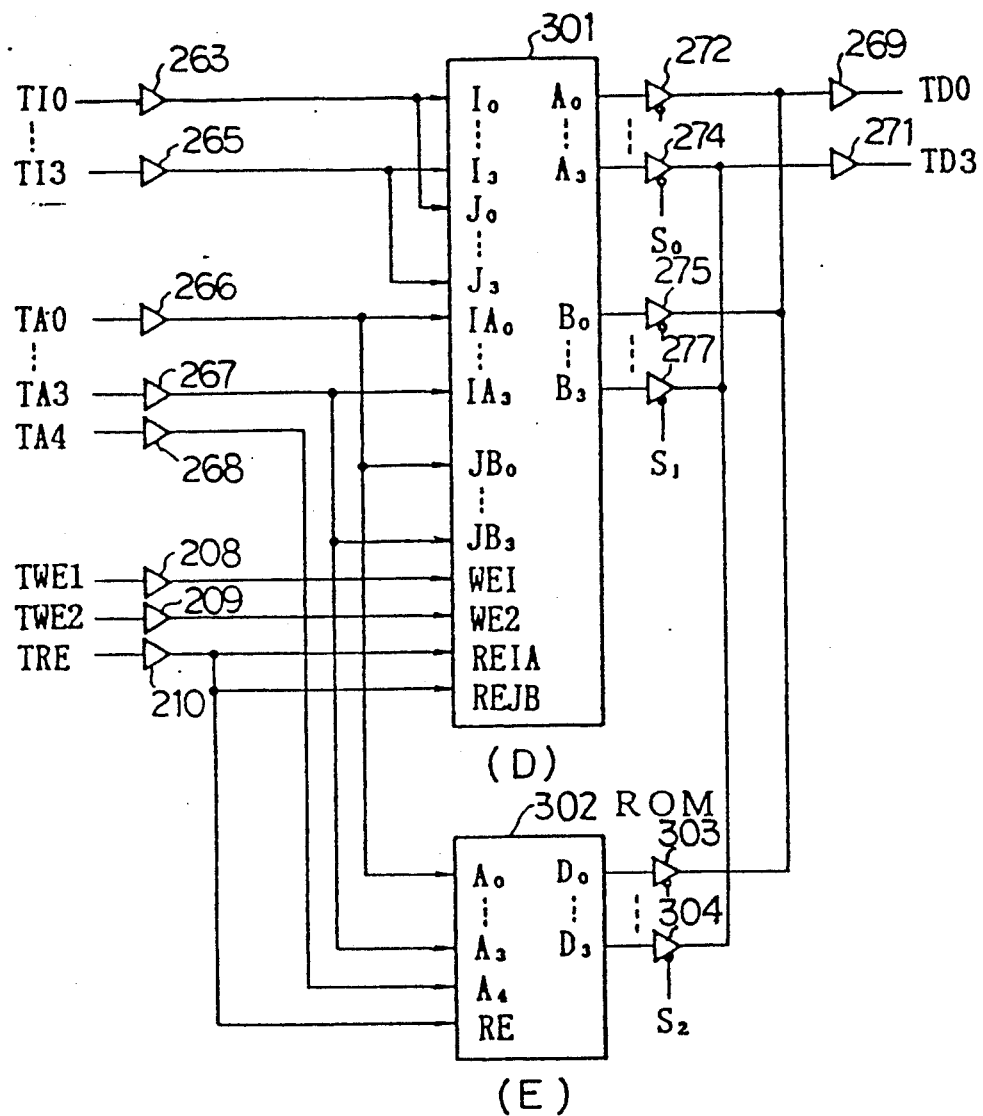
FIG. 23 is a schematic diagram of a seventh embodiment of a semiconductor IC device according to the present invention in which a dual port RAM and a ROM are mounted.

FIG. 23 is a schematic diagram of a seventh embodiment of the semiconductor IC device in accordance with the present invention. In this embodiment there are provided a 16-word×4-bit dual port RAM (D) and a 32-word×4-bit ROM (E). The parts of the embodiment of FIG. 23 identical to corresponding parts of the fifth embodiment of FIGS. 19 and 20 are designated by the same reference numerals and same reference characters and therefore a detailed description of the identical parts will not be given.

In FIG. 23, 301 is a 16-word×4-bit dual port RAM (multiport RAM), and 302 a 32-word×4-bit ROM. The 16-word×4-bit dual port RAM 301 and 32-word×4-bit ROM 302 are connected to a random logic circuit (not shown). In this embodiment, only test address signals TA0 through TA3 and test RAM enable signal TRE are connected to the ROM 302, from which the bits $D_0$ through $D_3$ are connected through port selectors 303 and 304 to external output terminals 269 and 271 in parallel relationship Therefore, in the embodiment of FIG. 23 one port selecting signal PS and one test write enable signal TWE are needed, and the relationship of the corresponding ports is shown in Table 9. Thus, even if a memory other than a multiport RAM exists, a test can be performed using the same test circuit.

TABLE 9

| PS1 | PS2 | Write enable signal TWE1 | Write enable signal TWE2 | Tested memory | Write port | Read port |
|---|---|---|---|---|---|---|
| L | L | Pulse | H | D | A-port | A-port |
| L | L | H | Pulse | D | B-port | A-port |
| L | H | Pulse | H | D | A-port | B-port |
| L | H | H | Pulse | D | B-port | B-port |
| H | L or H | H | H | E | | port |

Figure 24:
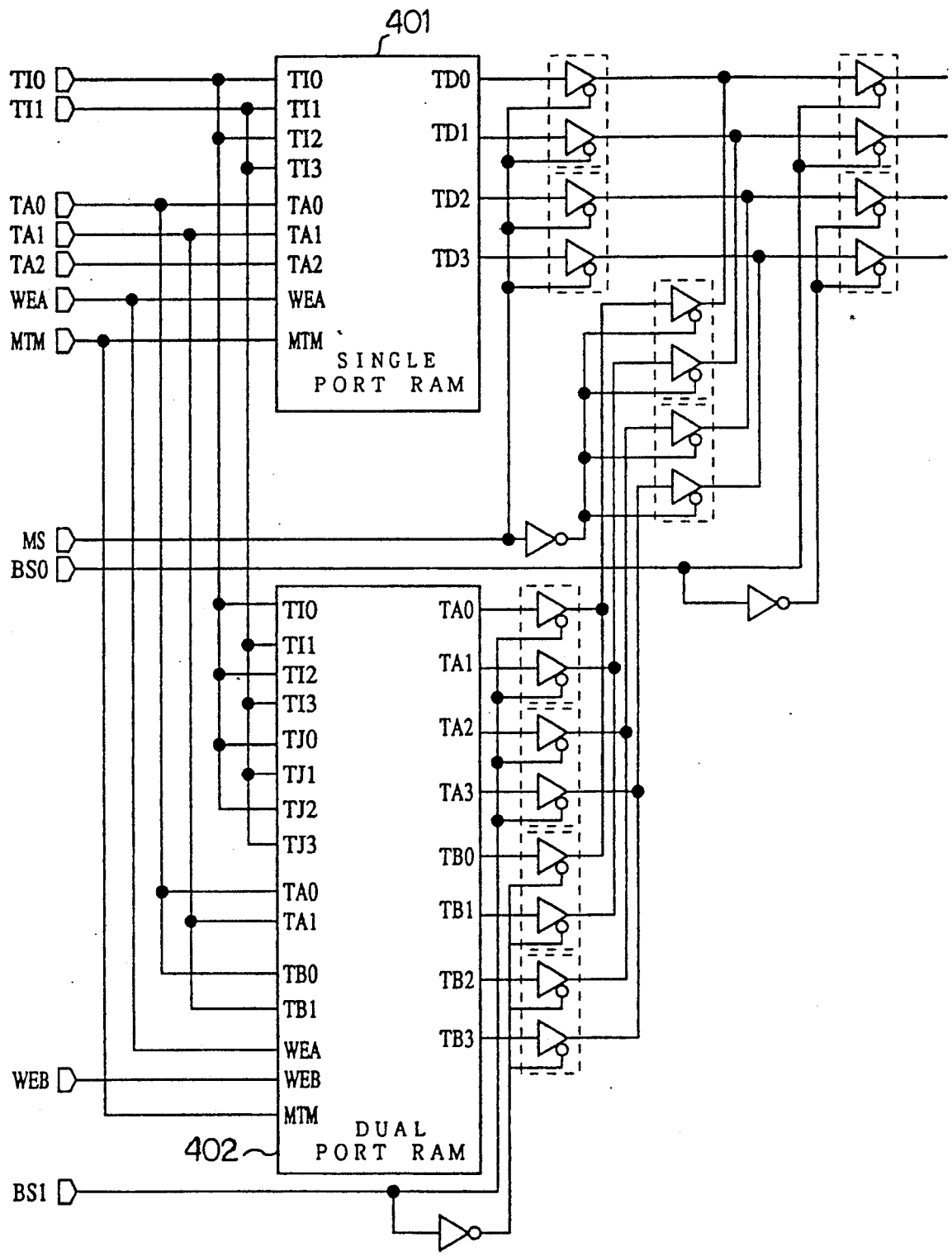
FIG. 24 is a schematic diagram of an eighth embodiment of a semiconductor IC device according to the present invention in which a single port RAM and a dual port RAM are mounted.

FIG. 24 schematically illustrates an eighth embodiment of a semiconductor IC device according to the present invention in which a single port RAM 401 and a dual port RAM 402 are mounted. The bit width of the single port RAM 401 can be divided and tested as in the case of the embodiment of FIG. 8, and the dual port RAM 402 can be tested as in the case of the embodiment of FIG. 23. Therefore, even if a single port memory and a multiport port memory are mounted together, the number of test external terminals can be greatly reduced. In addition, in order to reduce the number of the test external terminals, the bit width of a multiport memory can also be divided to a plurality of smaller bit widths, as in the case of the first embodiment of FIG. 8. In addition, although the 32-bit width of a single port RAM can be divided to two 16-bit widths in accordance with the embodiment of FIG. 8, the 32-bit width may be divided to two 17-bit widths in order to prevent the interference between bits which will occur when the 32-bit width is divided to two 16-bit widths.

While certain representative embodiments and details have been shown for the purpose of illustrating the invention, it will be apparent to those skilled in this art that various changes and modifications may be made therein without departing from the scope of the invention.

What we claim is:

1. A semiconductor integrated circuit device comprising:
   a first circuit forming a random logic and outputting a plurality of first parallel data of plural bits;
   a second circuit which receives said plurality of first parallel data and supplies a plurality of second parallel data of plural bits to said first circuit; and
   a test circuit which divides a part of external parallel data of plural bits smaller in number than said first parallel data into a plurality of third parallel data of plural bits in such a manner that said plurality of third parallel data correspond in number to said plurality of first parallel data.

2. A semiconductor integrated circuit device as set forth in claim 1, wherein said test circuit comprises an input selector part for switching said plurality of first parallel data and said external parallel data in response to external switch signals, said external parallel data comprising at least said plurality of third parallel data, and said selector part comprising at least input selector circuits corresponding in number to said plurality of third parallel data.

3. A semiconductor integrated circuit device as set forth in claim 1, wherein said second circuit comprises a single port random access memory.

4. A semiconductor integrated circuit device as set forth in claim 1, wherein said second circuit comprises a plurality of circuits each having a function equivalent to said second circuit.

5. A semiconductor integrated circuit device as set forth in claim 1, wherein said second circuit comprises two single port random access memories.

6. A semiconductor integrated circuit device as set forth in claim 1, wherein said second circuit comprises a single port random access memory and a read only memory.

7. A semiconductor integrated circuit device as set forth in claim 1, wherein said second circuit comprises a single port random access memory and a multiplier.

8. A semiconductor integrated circuit device as set forth in claim 1, wherein said second circuit comprises a multiport memory.

9. A semiconductor integrated circuit device as set forth in claim 1, wherein said second circuit comprises a dual port memory.

10. A semiconductor integrated circuit device as set forth in claim 1, wherein said second circuit comprises two dual port memories.

11. A semiconductor integrated circuit device as set forth in claim 1, wherein said second circuit comprises a triple port memory.

12. A semiconductor integrated circuit device as set forth in claim 1, wherein said second circuit comprises a multiport memory and a read only memory.

13. A semiconductor integrated circuit device comprising:
   a random logic circuit;
   a multiport memory having a plurality of inlet and outlet ports; and
   a test circuit for testing said multiport memory in response to an external test data;
   said test circuit being constructed in such a manner that said test data is divided every port of said multiport memory and that said multiport memory is tested as single port memories in accordance with said divided test data.

14. A semiconductor integrated circuit device comprising:
   a random logic circuit;
   a single port memory;
   a multiport memory; and
   a test circuit for testing said single port and multiport memories in response to an external test data;
   said test circuit being constructed in such a manner that it divides said single port and multiport memories into a plurality of parts having predetermined bit widths and tests said parts.

* * * * *